United States Patent
Nakako et al.

(10) Patent No.: US 10,566,304 B2
(45) Date of Patent: Feb. 18, 2020

(54) ASSEMBLY AND SEMICONDUCTOR DEVICE

(71) Applicant: HITACHI CHEMICAL COMPANY, LTD., Tokyo (JP)

(72) Inventors: Hideo Nakako, Tokyo (JP); Kazuhiko Kurafuchi, Tokyo (JP); Yoshinori Ejiri, Tokyo (JP); Dai Ishikawa, Tokyo (JP); Chie Sugama, Tokyo (JP); Yuki Kawana, Tokyo (JP)

(73) Assignee: HITACHI CHEMICAL COMPANY, LTD., Tokyo (JP)

( * ) Notice: Subject to any disclaimer, the term of this patent is extended or adjusted under 35 U.S.C. 154(b) by 0 days.

(21) Appl. No.: 15/757,852

(22) PCT Filed: Sep. 7, 2016

(86) PCT No.: PCT/JP2016/076330
§ 371 (c)(1),
(2) Date: Mar. 6, 2018

(87) PCT Pub. No.: WO2017/043540
PCT Pub. Date: Mar. 16, 2017

(65) Prior Publication Data
US 2018/0342478 A1 Nov. 29, 2018

(30) Foreign Application Priority Data
Sep. 7, 2015 (JP) .................................. 2015-176067

(51) Int. Cl.
*H01L 23/34* (2006.01)
*H01L 23/00* (2006.01)
(Continued)

(52) U.S. Cl.
CPC ............ *H01L 24/29* (2013.01); *B22F 1/0062* (2013.01); *B22F 7/08* (2013.01); *H01L 23/3675* (2013.01);
(Continued)

(58) Field of Classification Search
CPC ........................................................ H01L 24/29
(Continued)

(56) References Cited

U.S. PATENT DOCUMENTS

2010/0001237 A1* 1/2010 Fornes .................. B22F 1/0059
252/500
2010/0051319 A1 3/2010 Schmitt et al.
(Continued)

FOREIGN PATENT DOCUMENTS

DE 102011109226 A1 2/2013
EP 2158997 A2 3/2010
(Continued)

OTHER PUBLICATIONS

R. Khazaka, L. Mendizabal, and D. Henry, "Review on Joint Shear Strength of Nano-Silver Paste and Its Long-Term High Temperature Reliability", Journal of Electronic Materials, 2014 vol. 43, No. 7, p. 2459-p. 2466.
(Continued)

*Primary Examiner* — Ajay Arora
(74) *Attorney, Agent, or Firm* — Fitch, Even, Tabin & Flannery, L.L.P.

(57) ABSTRACT

Provided is a joined body including: a first member; a second member; and a sintered metal layer that joins the first member and the second member. The sintered metal layer includes a structure that is derived from flake-shaped copper particles which are oriented in approximately parallel to an interface between the first member or the second member, and the sintered metal layer, and the amount of copper
(Continued)

contained in the sintered metal layer is 65% by volume or greater on the basis of a volume of the sintered metal layer.

9 Claims, 18 Drawing Sheets

(51) Int. Cl.
*B22F 7/08* (2006.01)
*B22F 1/00* (2006.01)
*H01L 23/367* (2006.01)

(52) U.S. Cl.
CPC .............. *H01L 24/32* (2013.01); *H01L 24/73* (2013.01); *H01L 24/83* (2013.01); *B22F 2301/10* (2013.01); *H01L 2224/29239* (2013.01); *H01L 2224/29244* (2013.01); *H01L 2224/29247* (2013.01); *H01L 2224/29255* (2013.01); *H01L 2224/29264* (2013.01); *H01L 2224/29269* (2013.01); *H01L 2224/32225* (2013.01); *H01L 2224/32245* (2013.01); *H01L 2224/73213* (2013.01); *H01L 2224/73263* (2013.01); *H01L 2224/73265* (2013.01); *H01L 2224/8384* (2013.01)

(58) Field of Classification Search
USPC ........................................................ 257/717
See application file for complete search history.

(56) References Cited

U.S. PATENT DOCUMENTS

2013/0256894 A1* 10/2013 Adema .................. H01L 24/83
257/762
2013/0299962 A1 11/2013 Ide et al.

FOREIGN PATENT DOCUMENTS

| JP | 4928639 B2 | 12/2011 |
| JP | 5006081 B2 | 8/2012 |
| JP | 2013-239486 A | 11/2013 |
| JP | 2013-247060 A | 12/2013 |
| JP | 2014-167145 A | 9/2014 |
| WO | 2013/125022 A1 | 8/2013 |

OTHER PUBLICATIONS

Katsuhiro Ueda, Sumio Inafuku, Iwao Mori, "Obtainment of Sectional Area of Stearic Acid Molecule—Experimental Value and Calculated Value—", Chemistry & Education, 1992, vol. 40 No. 2, p. 114-p. 117.

* cited by examiner

ASSEMBLY AND SEMICONDUCTOR DEVICE

CROSS-REFERENCE TO RELATED APPLICATIONS

This application is a U.S. national phase application filed under 35 U.S.C. § 371 of International Application No. PCT/JP2016/076330, filed Sep. 7, 2016, which claims priority from Japanese Patent Application No. 2015-176067, filed Sep. 7, 2015, designating the United States, which are hereby incorporated herein by reference in their entirety.

TECHNICAL FIELD

The present invention relates to a joined body and a semiconductor device.

BACKGROUND ART

When manufacturing semiconductor devices, various joining materials are used to join a semiconductor element and a lead frame and the like (support member). When joining a power semiconductor, an LSI, and the like, which are operated at a high temperature of 150° C. or higher, among the semiconductor devices, high-melting-point lead solder is used as a joining material. In recent years, a demand for an operation at a high temperature of 175° C. or higher has been increased due to large capacity and space saving of a semiconductor element. Accordingly, at a joining portion formed from a high melting point solder layer, heat resistance and thermal conductivity become insufficient, and thus it is difficult to secure connection reliability. On the other hand, a joining material, which does not contain lead, is demanded in accordance with strengthening of RoHS regulations.

Joining of a semiconductor element by using a material other than lead solder has been examined. For example, Patent Literature 1 suggests a technology of forming a sintered silver layer by sintering silver nanoparticles at a low temperature. It is known that the sintered silver has high connection reliability with respect to a power cycle.

A technology of forming a sintered copper layer by sintering copper particles as another material is also suggested. For example, Patent Literature 2 discloses copper paste for joining which includes a cupric oxide particles and a reducing agent as a joining material for joining a semiconductor element and an electrode. In addition, Patent Literature 3 discloses a joining material that includes copper nano particles, and copper micro particles, copper sub-micro particles, or both of the copper micro particles and the copper sub-micro particles.

CITATION LIST

Patent Literature

Patent Literature 1: Japanese Patent No. 4928639
Patent Literature 2: Japanese Patent No. 5006081
Patent Literature 3: Japanese Unexamined Patent Publication No. 2014-167145

Non-Patent Literature

Non Patent Literature 1: R. Khazaka, L. Mendizabal, D. Henry: J. ElecTron. Mater, 43(7), 2014, 2459 to 2466

SUMMARY OF INVENTION

Technical Problem

In a high-temperature operation of a semiconductor device, connection reliability at a joining portion that joins a semiconductor element becomes an important problem. Copper has a modulus of shear elasticity higher than that of silver (copper: 48 GPa, silver: 30 GPa), and has a coefficient of thermal expansion lower than that of silver (copper: 17 µm/(m·k), silver: 19 µm/(m·k)). Accordingly, connection reliability of a semiconductor device described in Patent Literature 2 and an electronic component and the like described in Patent Literature 3 may be more excellent in comparison to a joined body including a sintered silver layer described in Patent Literature 1.

However, the present inventors found that in a case where the joined portion is a sintered metal layer, not only physical properties of a constituent metal but also morphology of the sintered metal layer has an effect on the connection reliability. In Patent Literature 1 to Patent Literature 3, a relationship between the morphology of the sintered layer and the connection reliability is not revealed, and particularly, a sintered metal layer, which is capable of satisfying connection reliability at a temperature cycle test including high temperature conditions, is not realized.

An object of the invention is to provide a joined body including a sintered metal layer having sufficient connection reliability even at a temperature cycle test including high temperature conditions, and a semiconductor device.

Solution to Problem

To solve the above-described problem, the present inventors have made a thorough investigation, and they found that a sintered metal layer formed from specific copper paste for joining that includes flake-shaped copper particles is excellent in thermal conductivity and joining strength, and has a structure in which sufficient connection reliability is provided even in a temperature cycle test including high temperature conditions. As a result, they have accomplished the invention on the basis of the above-described finding.

According to an aspect of the invention, there is provided a joined body including: a first member; a second member; and a sintered metal layer that joins the first member and the second member. The sintered metal layer includes a structure that is derived from flake-shaped copper particles which are oriented in approximately parallel to an interface between the first member or the second member, and the sintered metal layer, and the amount of copper contained in the sintered metal layer is 65% by volume or greater on the basis of a volume of the sintered metal layer.

Furthermore, in this specification, "flake shape" includes a flat plate shape such as a plate shape and a squamous shape.

The joined body of the invention includes the sintered metal layer, and thus sufficient connection reliability can be exhibited even in a temperature cycle test including a high temperature condition. The reason why the effect is obtained is considered as follows. The sintered metal layer has copper denseness of 65% by volume or greater, and thus sufficient thermal conductivity and joining strength are obtained. In addition, the sintered metal layer includes a structure derived from flake-shaped copper particles which are oriented in a predetermined direction. Accordingly, it is considered that the following operations and the like are obtained. That is, a thermal stress is dispersed, and even when a part of the sintered metal layer is fractured, the fracture is less likely to spread.

In the joined body, at least one of the first member and the second member may include at least one kind of metal selected from the group consisting of copper, nickel, palladium, silver, gold, platinum, lead, tin, and cobalt on a surface that is in contact with the sintered metal layer. In this case, it is possible to further enhance adhesiveness between at least one of the first member and the second member, and the sintered metal layer.

According to another aspect of the invention, there is provided a semiconductor device including: a first member; a second member; and a sintered metal layer that joins the first member and the second member. At least one of the first member and the second member is a semiconductor element, the sintered metal layer includes a structure that is derived from flake-shaped copper particles which are oriented in approximately parallel to an interface between the first member or the second member, and the sintered metal layer, and the amount of copper contained in the sintered metal layer is 65% by volume or greater on the basis of a volume of the sintered metal layer.

The semiconductor device of the invention includes the sintered metal layer capable of exhibiting sufficient connection reliability even in a temperature cycle test including a high temperature condition, and thus high-temperature operation properties can be improved, and it is possible to cope with large capacity of a semiconductor element and space saving.

In the semiconductor device, die shear strength may be 30 MPa or greater.

According to still another aspect of the invention, there is provided a semiconductor device including: a first electrode; a semiconductor element that is electrically connected to the first electrode; and a second electrode that is electrically connected to the semiconductor element through a metal interconnection. A sintered metal layer, which includes copper, is provided between the semiconductor element and the metal interconnection, and between the metal interconnection and the second electrode.

The semiconductor device of the invention includes the sintered metal layer capable of exhibiting sufficient connection reliability even in a temperature cycle test including a high temperature condition, and thus high-temperature operation properties can be improved, and it is possible to cope with large capacity of a semiconductor element and space saving.

In the semiconductor device, the sintered metal layer may be in contact with the metal interconnection, and may include a structure derived from flake-shaped copper particles which are oriented in approximately parallel to an interface with the metal interconnection, and the amount of copper contained in the sintered metal layer may be 65% by volume or greater on the basis of a volume of the sintered metal layer.

According to still another aspect of the invention, there is provided a semiconductor device including: a first thermal conduction member; a second thermal conduction member; and a semiconductor element that is disposed between the first thermal conduction member and the second thermal conduction member. A sintered metal layer, which includes copper, is provided at least one side between the first thermal conduction member and the semiconductor element, and between the semiconductor element and the second thermal conduction member.

The semiconductor device of the invention includes the sintered metal layer capable of exhibiting sufficient connection reliability even in a temperature cycle test including a high temperature condition, and thus high-temperature operation properties can be improved, and it is possible to cope with large capacity of a semiconductor element and space saving.

In the semiconductor device, the sintered metal layer may be in contact with the first thermal conduction member or the second thermal conduction member, and may include a structure derived from flake-shaped copper particles which are oriented in approximately parallel to an interface with the first thermal conduction member or the second thermal conduction member, and the amount of copper contained in the sintered metal layer may be 65% by volume or greater on the basis of a volume of the sintered metal layer.

Advantageous Effects of Invention

According to the invention, it is possible to provide a joined body including a sintered metal layer having sufficient connection reliability even at a temperature cycle test including high temperature conditions, and a semiconductor device.

DESCRIPTION OF EMBODIMENTS

Figure 1:
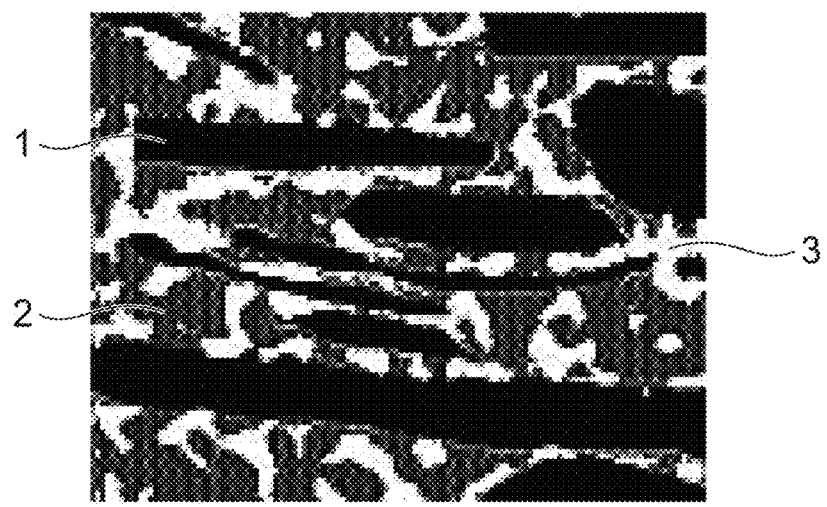
FIG. 1 is a schematic cross-sectional view illustrating an example of typical morphology of a sintered metal layer in a joined body of this embodiment.

Hereinafter, a mode for carrying out the invention (hereinafter, referred to as "this embodiment") will be described in detail. The invention is not limited to the following embodiment.

Hereinafter, a preferred embodiment will be described in detail with reference to the accompanying drawings. Furthermore, in the drawings, the same reference numeral will be given to the same or equivalent portions, and redundant description thereof will be omitted. In addition, dimension ratios in the drawing are not limited to ratios illustrated in the drawings.

<Joined Body>

A joined body according to this embodiment includes a first member, a second member, and a sintered metal layer that joins the first member and the second member. The sintered metal layer has a predetermined orientation structure, and the amount of copper contained in the sintered metal layer is 65% by volume or greater on the basis of a volume of the sintered metal layer.

FIG. 1 is a schematic cross-sectional view illustrating an example of typical morphology of a sintered metal layer in a joined body of this embodiment. The sintered metal layer illustrated in FIG. 1 includes sintered copper 1 that has a structure (hereinafter, may be referred to as "flake-shaped structure") derived from flake-shaped copper particles, sintered copper 2 that is derived from other copper particles, and a vacancy 3.

Figure 2:
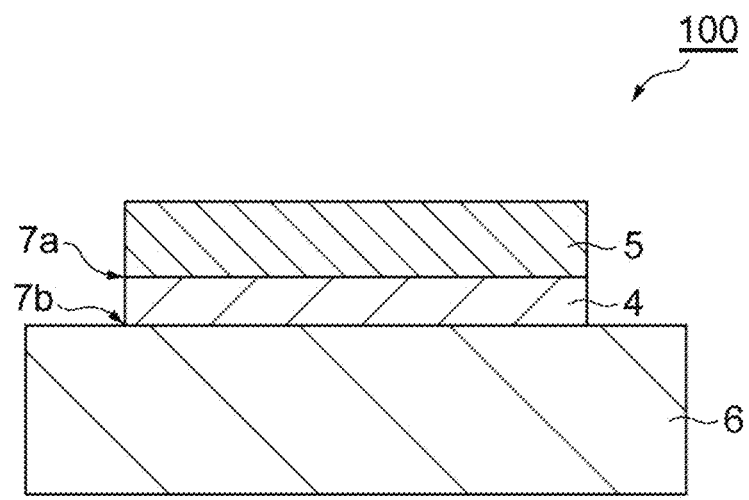
FIG. 2 is a schematic cross-sectional view illustrating an example of a joined body that is manufactured by using copper paste for joining of this embodiment.

FIG. 2 is a schematic cross-sectional view illustrating an example of the joined body of this embodiment. A joined body 100 illustrated in FIG. 2 includes a first member 5, a second member 6, and a sintered metal layer 4 that joins the first member 5 and the second member 6.

Examples of the first member 5 and the second member 6 include semiconductor elements such as an IGBT, a diode, a Schottky barrier diode, a MOS-FET, a thyristor, a logic, a sensor, an analog integrated circuit, an LED, a semiconductor laser, and a transmitter, a base material for semiconductor element mounting such as a lead frame, a metal plate-attached ceramic substrate (for example, DBC), and an LED package, a metal interconnection such as a copper ribbon and a metal frame, a block body such as a metal block, a power supply member such as a terminal, a heat dissipation plate, a water cooling plate, and the like.

The first member 5 and the second member 6 may include a metal on surfaces 7a and 7b which are in contact with a sintered metal layer 4. Examples of the metal include copper, nickel, silver, gold, palladium, platinum, lead, tin, cobalt, and the like. The metals may be used alone or in combination of two or more kinds thereof. In addition, the surfaces which are in contact with the sintered body may an alloy including the metals. Examples of metals which can be used in the alloy include zinc, manganese, aluminum, beryllium, titanium, chromium, iron, molybdenum, and the like in addition to the above-described metals. Examples of a member including a metal on a surface that is in contact with the sintered metal layer include a member including various kinds of metal plating, a wire, a chip including metal plating, a heat spreader, a metal plate-attached ceramic substrate, a lead frame including various kinds of metal plating or a lead frame constituted by various kinds of metals, a copper plate, and copper foil. In addition, in a case where the second member 6 is a semiconductor element, the first member 5 may be a metal interconnection such as a metal frame, a block body such as a metal block having thermal conductivity and electric conductivity, and the like.

In the sintered metal layer of this embodiment, a ratio of a copper element excluding light elements among constituent elements may be 95% by mass or greater, 97% by mass or greater, 98% by mass or greater, or 100% by mass. When the ratio of the copper element in the sintered metal layer is within the above-described range, it is possible to suppress formation of an intermetallic compound or precipitation of a heteroelement to a metal copper crystal grain boundary, the property of the metal copper that constitutes the sintered metal layer is likely to be strong, and it is possible to easily obtain further excellent connection reliability.

The ratio of the copper element excluding the light elements can be quantified through scanning electron microscope-energy dispersive X-ray spectroscope (SEM-EDX) measurement, inductively couple plasma-optical emission spectrometry (ICP-OES) measurement, inductively coupled plasma-mass spectrometry (ICP-MS) measurement, and the like with respect to the sintered metal layer.

The sintered copper having the flake-shaped structure according to this embodiment can be formed by sintering copper paste for joining that includes flake-shaped copper particles. Furthermore, the "flake shape" includes a flat plate shape such as a plate shape and a squamous shape. In the flake-shaped structure, a ratio between the major axis and the thickness may be 5 or greater. A number-average diameter of the flake-shaped structure may be 2 μm or greater, 3 μm or greater, or 4 μm or greater. When the shape of the flake-shaped structure is within this range, a reinforcing effect due to the flake-shaped structure included in the sintered metal layer is improved, and thus the joined body has further excellent joining strength and connection reliability.

The major axis and the thickness of the flake-shaped structure can be obtained, for example, from a SEM image of a joined body. Hereinafter, a method of measuring the major axis and the thickness of the flake-shaped structure of the joined body will be exemplified. An epoxy curing resin is poured to the joined body to bury the entirety of a sample, and the epoxy casting resin is cured. The casted sample is cut in the vicinity of a cross-section to be observed, and the cross-section is ground through polishing and is subjected to cross-section polisher (CP) processing. The cross-section of the sample is observed with a SEM apparatus at a magnification of 5000 times. A cross-sectional image (for example, 5000 times) of the joined body is acquired. At a dense continuous portion having a linear shape, a rectangular parallelepiped shape, or an elliptical shape, when the longest straight line among straight lines included in the portion is set as the major axis, and the longest straight line among straight lines which are included in the portion and are perpendicular to the major axis is set as the thickness, a structure in which the size of the major axis is 1 μm or greater and a ratio of the major axis/the thickness is 4 or greater is regarded as the flake-shaped structure. The major axis and the thickness of the flake-shaped structure can be measured by image processing software having a length measurement function. An average value thereof can be obtained by calculating a number average of randomly selected 20 sites or greater.

Figure 3:
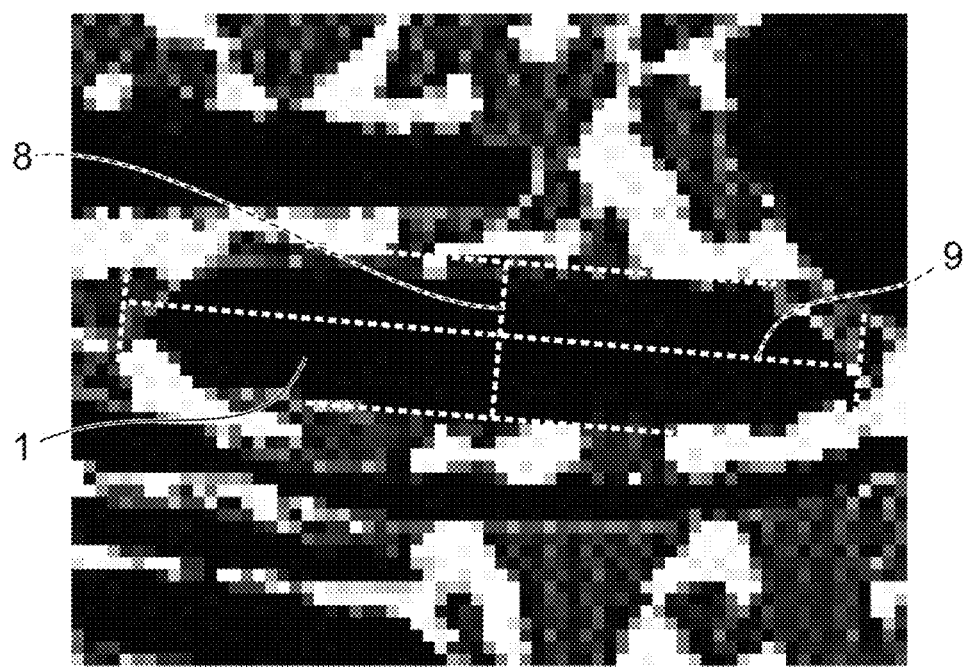
FIG. 3 is an enlarged view of FIG. 1 and is a schematic cross-sectional view illustrating a method of measuring a major axis and a thickness of a structure derived from flake-shaped copper particles.

FIG. 3 is an enlarged view of the sintered copper 1 having the flake-shaped structure illustrated in FIG. 1. As illustrated in FIG. 3, the major axis 9 of the flake-shaped structure is given as a distance between two parallel straight lines selected among a plurality of pairs of parallel straight lines circumscribed to the flake-shaped structure so that the distance between the two straight lines becomes the maximum. The thickness 8 of the flake-shaped structure is given as a distance between two parallel planes which are perpendicular to the two parallel straight lines between which the major axis is obtained, and are selected among a plurality of pairs of parallel planes circumscribed to the flake-shaped structure so that the distance between the two parallel planes becomes the maximum.

As the image processing software, for example, Microsoft Powerpoint (manufactured by Microsoft), and ImageJ (manufactured by National Institutes of Health) can be used without particular limitation.

The degree of orientation of the structure derived from the flake-shaped copper particles which are oriented in approximately parallel to an interface between the first member or the second member, and the sintered metal layer can be expressed by the degree of orientation order S. The degree of orientation order S can be calculated by Expression (1).

$$S = \frac{1}{2} \times (3 \langle \cos^2 \theta \rangle - 1) \quad (1)$$

In Expression, $\theta$ represents an angle made by the interface and the flake-shaped structure, and $\langle \cos^2 \theta \rangle$ represents an average value of a plurality of values of $\cos^2 \theta$.

The degree of orientation order S may be 0.88 to 1.00, 0.90 to 1.00, or 0.92 to 1.00. When the degree of orientation order S is within this range, the flake-shaped structure included in the sintered metal layer are oriented in approximately parallel to a joining surface, and thus joining strength and connection reliability of the joined body tend to be improved.

Figure 4:
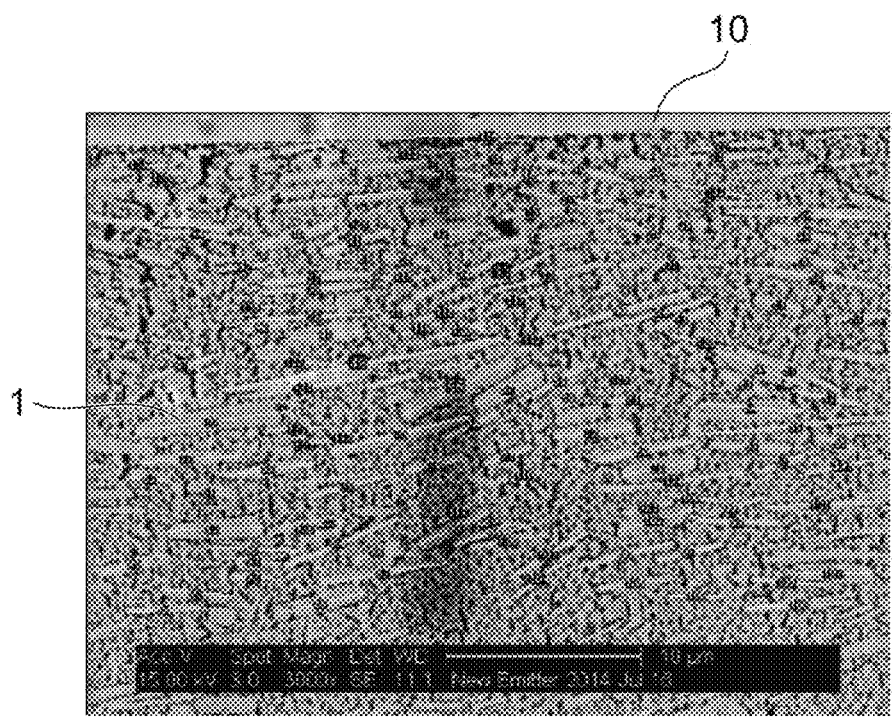
FIG. 4 is a schematic cross-sectional view illustrating a method of measuring an angle θ with respect to a joining surface of the structure derived from the flake-shaped copper particles of the joined body of this embodiment.

The degree of orientation order S can be obtained, for example, from a SEM image of the joined body. Hereinafter, a method of calculating the degree of orientation order S from the SEM image will be exemplified. A SEM cross-sectional view of the joined body is obtained by the same method as in measurement of the major axis and the thickness of the flake-shaped structure. With respect to a cross-sectional image that is obtained, an angle made by the major axis of the flake-shaped structure and an interface is measured by using image processing software having an angle measurement function. FIG. 4 is a schematic cross-sectional view illustrating a method of measuring an angle $\theta$ of the flake-shaped structure in the joined body of this embodiment with respect to a joining surface. As illustrated in FIG. 4, with respect to randomly selected 50 or greater flake-shaped structures, the angle $\theta$ of the sintered copper 1 having the flake-shaped structure with respect to a joining surface of a chip 10 is measured, and is substituted for Expression (1) to calculate the degree of orientation order S. The degree of orientation order S has a value of 0 to 1. The degree of orientation order S becomes 1 in a completely oriented state, and becomes 0 in a completely random state.

As the image processing software, for example, Microsoft Powerpoint (manufactured by Microsoft), and ImageJ (manufactured by National Institutes of Health) can be used without particular limitation.

A ratio of the flake-shaped structure contained with respect to the entirety of a structure can be calculated by a method described in the following examples. That is, a cross-sectional area of the joined body is obtained from the SEM image of the joined body, and a cross-sectional area of the flake-shaped structure is obtained from the major axis and the thickness of the flake-shaped structure which are measured by the above-described method, and a total cross-sectional area of the flake-shaped structure obtained by summing the cross-sectional areas is divided by the cross-sectional area of the joined body to calculate the ratio of the flake-shaped structure contained with respect to the entirety of a structures. In the joined body according to this embodiment, the ratio of the flake-shaped structure contained with respect to the entirety of a structure, which is obtained by the method, may be 10% to 40%, or 20% to 30%.

The amount (volume ratio) of copper contained in the sintered metal layer may be set to 65% by volume or greater on the basis of a volume of the sintered metal layer. When the amount of copper contained in the sintered metal layer is within the above-described range, it is possible to suppress formation of a large vacancy in the sintered metal layer or loosening of sintered copper that connects flake-shaped structures. Accordingly, when the amount of copper contained in the sintered metal layer is within the above-described range, sufficient thermal conductivity is obtained, the joining strength between the members and the sintered metal layer is improved, and connection reliability of the joined body becomes excellent. The amount of copper contained in the sintered metal layer may be 67% by volume or greater, or 70% by volume or greater on the basis of the volume of the sintered metal layer. The amount of copper contained in the sintered metal layer may be 90% by volume or less on the basis of the volume of the sintered metal layer from the viewpoint of easiness of a manufacturing process.

When a composition of a material that constitutes the sintered metal layer is known, for example, the amount of copper contained in the sintered metal layer can be obtained in the following procedure. First, the sintered metal layer is cut out in a rectangular parallelepiped shape. In addition, a vertical length and a horizontal length of the sintered metal layer are measured by a vernier calipers or an external shape measuring apparatus, and the thickness of the sintered metal layer is measured by a film thickness measuring device. The volume of the sintered metal layer is calculated by using the lengths and the thickness. An apparent density $M_1$ (g/cm$^3$) is obtained from the volume of the sintered metal layer that is cut out, and the weight of the sintered metal layer which is measured with a precision balance. The amount (% by volume) of copper contained in the sintered metal layer is obtained from the following Expression (2) by using $M_1$ that is obtained, and a copper density 8.96 g/cm$^3$.

$$\text{The amount (\% by volume) of copper contained in the sintered metal layer} = [(M_1)/8.96] \times 100 \quad (2)$$

The joining strength of the joined body may be 10 MPa or greater, 15 MPa or greater, 20 MPa or greater, or 30 MPa or greater. The joining strength can be measured by using a full-universal type bond tester (4000 series, manufactured by DAGE corporation), and the like.

The thermal conductivity of the sintered metal layer may be 100 W/(m·k) or greater, 120 W/(m·k) or greater, or 150 W/(m·k) or greater from the viewpoints of heat dissipation and connection reliability at a high temperature. The thermal conductivity can be calculated from thermal diffusivity, specific heat capacity, and a density of the sintered metal layer. For example, the thermal diffusivity of the sintered metal layer is measured by a laser flash method (LFA467, manufactured by Netch. Co. Ltd). The thermal conductivity

[W/(m·k)] of the sintered metal layer at 25° C. can be calculated by the product of the thermal diffusivity, specific heat capacity obtained by a differential scanning calorimeter (DSC8500, manufactured by PerkinElmer Co., Ltd.), and the density obtained as described above.

In the joined body (for example, an electronic device and the like) according to this embodiment, even in a case where a thermal stress occurred due to a difference in a coefficient of thermal expansion between joined members is applied to the sintered metal layer (joining layer), high connection reliability can be maintained. The reason for this is assumed as follows. Even when the thermal stress occurs, a stress is dispersed in the flake-shaped structure, and thus stress concentration is less likely to occur. In addition, even when a part of porous sintered copper is broken, the breakage is stopped by sintered copper having the flake-shaped structure, and thus the connection reliability of the joined body is enhanced. In addition, the sintered metal layer sufficiently includes metal copper that is connected by a metal bond. Accordingly, high thermal conductivity is exhibited, and thus rapid heat dissipation is possible in mounting of an electronic device in which heat generation is great. In addition, the sintered metal layer is strongly joined by the metal bond, and thus the sintered metal layer can exhibit excellent joining strength with respect to members including the metal. As described above, the sintered metal layer according to this embodiment has properties which are very effective for joining of an electronic device such as a power device, logics, and an amplifier in which heat generation is great. In the joined body to which the sintered metal layer is applied, relatively high input power can be permitted, and an operation at a high operation temperature is possible.

<Method for Manufacturing Joined Body>

The joined body of this embodiment can be manufactured, for example, by the following method. Examples of the method for manufacturing the joined body include a method including a process of preparing a laminated body in which the first member, and the copper paste for joining and the second member, which are disposed on a side on which own weight of the first member acts, are laminated in this order, and sintering the copper paste for joining in a state of receiving the own weight of the first member, or the own weight of the first member and a pressure of 0.01 MPa or lower.

For example, the laminated body can be prepared by providing the copper paste for joining at a necessary portion of the second member and by disposing the first member on the copper paste for joining.

A method for providing the copper paste for joining of this embodiment at the necessary portion of the second member may be a method in which the copper paste for joining is deposited. As the method, for example, screen printing, transfer printing, offset printing, a jet printing method, a dispenser, a jet dispenser, a needle dispenser, a comma coater, a slit coater, a die coater, a gravure coater, slit coat, relief printing, intaglio printing, gravure printing, stencil printing, soft lithography, bar coat, an applicator, a particle deposition method, a spray coater, a spin coater, a dipping coater, electrodeposition coating, and the like can be used. The thickness of the copper paste for joining may 1 μm to 1000 μm, 10 μm to 500 μm, 50 μm to 200 μm, 10 μm to 3000 μm, 15 μm to 500 μm, 20 μm to 300 μm, 5 μm to 500 μm, 10 μm to 250 μm, or 15 μm 150 μm.

The copper paste for joining that is provided on the second member may be appropriately dried from the viewpoint of suppressing occurrence of flowing and voids during sintering. A gas atmosphere during drying may be set to the atmosphere, an oxygen-free atmosphere such as nitrogen and an inert gas, or a reducing atmosphere such as hydrogen and formic acid. A drying method may be drying through being left at room temperature, drying under heating, drying under a reduced pressure. In the drying under heating or the drying under a reduced pressure, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, a hot-plate press apparatus, and the like can be used. A drying temperature and a drying time may be appropriately adjusted in accordance with the kind and the amount of the dispersion medium that is used. With regard to the drying temperature and the drying time, for example, drying may be performed at a temperature of 50° C. to 180° C. for 1 minute to 120 minutes.

With regard to a method for disposing the first member on the copper paste for joining, for example, a chip mounter, a flip chip bonder, a positioning jig formed from carbon or ceramic can be exemplified. Furthermore, the above-described drying process may be performed after the process of disposing the first member.

The laminated body is heated to sinter the copper paste for joining. Sintering is performed in the heating. With regard to the heating treatment, for example, a hot plate, a hot wind drier, a hot wind heating furnace, a nitrogen drier, an infrared drier, an infrared heating furnace, a far infrared heating furnace, a microwave heating apparatus, a laser heating apparatus, an electromagnetic heating apparatus, a heater heating apparatus, a vapor heating furnace, and the like can be used.

A gas atmosphere during sintering may be an oxygen-free atmosphere from the viewpoint of suppressing oxidation of the sintered body, the first member, the second member. The gas atmosphere during sintering may be a reducing atmosphere from the viewpoint of removing a surface oxide of copper particles of the copper paste for joining. With regard to the oxygen-free atmosphere, introduction of an oxygen-free gas such as nitrogen and an inert gas, or a vacuum state can be exemplified. Examples of the reducing atmosphere include atmospheres in a pure hydrogen gas, in a mixed gas of hydrogen and nitrogen which are represented by a foaming gas, in nitrogen including a formic acid gas, in a mixed gas of hydrogen and an inert gas, in an inert gas including a formic acid gas, and the like.

The highest temperature reached in the heating treatment may 250° C. to 450° C., 250° C. to 400° C., or 250° C. to 350° C. from the viewpoints of reducing thermal damage to the first member and the second member and of improving a yield ratio. When the highest temperature reached is 200° C. or higher, if a retention time of the highest temperature reached is 60 minutes or shorter, sintering tends to be sufficiently progressed.

The retention time of the highest temperature reached may be 1 minute to 60 minutes, equal to or longer than 1 minute and shorter than 40 minutes, or equal to or longer than 1 minute and shorter than 30 minutes from the viewpoints of vaporizing the entirety of the dispersion medium and of improving a yield ratio.

A pressure during joining may be set to a condition in which the amount (deposition ratio) of copper contained in the sintered body becomes 65% by volume or greater on the basis of the sintered body. For example, when using the copper paste for joining to be described below, even though the laminated body is sintered without pressurization, it is possible to form the sintered metal layer according to this embodiment. In this case, it is possible to obtain sufficient joining strength in a state of receiving the own weight of the first member laminated on the copper paste for joining, or in a state of receiving the own weight of the first member and a pressure of 0.01 MPa or less, and preferably 0.005 MPa or less. When the pressure received during sintering is within the above-described range, a particular pressurizing apparatus is not necessary. Accordingly, a yield ratio does not deteriorate, and it is possible to further reduce voids and it is possible to further improve joining strength and connection reliability. As a method in which the copper paste for joining receives a pressure of 0.01 MPa or less, for example, a method in which a weight is placed on the first member can be exemplified.

(Copper Paste for Joining)

An example of the copper paste for joining that can be used in the method of manufacturing the joined body of this embodiment will be described below.

Copper paste for joining according to this embodiment is copper paste for joining that includes metal particles and a dispersion medium. The metal particles include sub-micro copper particles and flake-shaped micro copper particles.

(Metal Particles)

Examples of the metal particles according to this embodiment include the sub-micro copper particles, the flake-shaped micro copper particles, other metal particles other than copper particles, and the like.

(Sub-Micro Copper Particles)

Examples of the sub-micro copper particles include sub-micro copper particles including copper particles having a particle size of 0.12 μm to 0.8 μm. For example, copper particles having a volume-average particle size of 0.12 μm to 0.8 μm can be used. When the volume-average particle size of the sub-micro copper particles is 0.12 μm or greater, it is easy to obtain an effect such as suppression of the synthesizing cost of the sub-micro copper particles, satisfactory dispersibility, and suppression of the amount of surface treatment agent that is used. When the volume-average particle size of the sub-micro copper particles is 0.8 μm or less, it is easy to obtain an effect such as excellent sinterability of the sub-micro copper particles. From the viewpoint of further obtaining the effect, the volume-average particle size of the sub-micro copper particles may be 0.15 μm to 0.8 μm, 0.15 μm to 0.6 μm, 0.2 μm 0.5 μm, or 0.3 μm to 0.45 μm.

Furthermore, the volume-average particle size in this specification represents 50% volume-average particle size. When obtaining the volume-average particle size of the copper particles, the volume-average particle size can be obtained by the following method. Specifically, copper particles which become a raw material, or dry copper particles obtained by removing a volatile component from the copper paste for joining are dispersed in a dispersion medium by using a dispersing agent, and the volume-average particle size of the resultant dispersed material is measured by using a light-scattering method particle size distribution measuring apparatus (for example, a shimadzu nano particle size distribution measuring apparatus (SALD-7500 nano, manufactured by Shimadzu Corporation), and the like. In the case of using the light-scattering method particle size distribution measuring apparatus, as the dispersion medium, hexane, toluene, α-terpineol, and the like can be used.

The sub-micro copper particles can include copper particles having a particle size of 0.12 μm to 0.8 μm in an amount of 10% by mass or greater. From the viewpoint of sinterability of the copper paste for joining, the sub-micro copper particles can include the copper particles having a particle size of 0.12 μm to 0.8 μm in an amount of 20% by mass or greater, 30% by mass or greater, or 100% by mass. When the content ratio of the copper particles having a particle size of 0.12 μm to 0.8 μm is 20% by mass or greater in the sub-micro copper particles, the dispersibility of the copper particles is further improved, and it is possible to further suppress an increase in viscosity and a decrease in paste concentration.

The particle size of the copper particles can be obtained by the following method. The particle size of the copper particles can be calculated, for example, from a SEM image. A powder of the copper particles is placed on a carbon tape for SEM by using a spatula, and is set as a sample for SEM. The sample for SEM is observed by a SEM apparatus at a magnification of 5000 times. A rectangle that is circumscribed to a copper particle on the SEM image is drawn by using image processing software, and one side of the rectangle is set as a particle size of the particle.

The amount of the sub-micro copper particles contained may be 20% by mass to 90% by mass on the basis of the total mass of metal particles, 30% by mass to 90% by mass, 35% by mass to 85% by mass, or 40% by mass to 80% by mass. When the amount of the sub-micro copper particles contained is in the above-described range, it is easy to form the sintered metal layer according to this embodiment.

The amount of the sub-micro copper particles contained may be 20% by mass to 90% by mass on the basis of the sum of the mass of the sub-micro copper particles and the mass of the flake-shaped micro copper particles. When the amount of the sub-micro copper particles contained is 20% by mass or greater, a space between the flake-shaped micro copper particles can be sufficient filled with the sub-micro copper particles, and it is easy to form the sintered metal layer according to this embodiment. When the amount of the sub-micro copper particles contained is 90% by mass or less, it is possible to sufficiently suppress volume shrinkage when sintering the copper paste for joining, and thus it is easy to form the sintered metal layer according to this embodiment. From the viewpoint of further obtaining the effect, the amount of the sub-micro copper particles contained may be 30% by mass to 85% by mass on the basis of the sum of the mass of the sub-micro copper particles and the mass of the flake-shaped micro copper particles, 30% by mass to 85% by mass, 35% by mass to 85% by mass, or 40% by mass to 80% by mass.

A shape of the sub-micro copper particles is not particularly limited. Examples of the shape of the sub-micro copper particles include a spherical shape, a bulky shape, a needle shape, a flake shape, an approximately spherical shape, and an aggregate thereof. From the viewpoints of dispersibility and filling properties, the shape of the sub-micro copper particles may be the spherical shape, the approximately spherical shape, or the flake shape, and from the viewpoints of combustibility, dispersibility, mixability with flake-shaped micro particles, and the like, the shape of the sub-micro copper particles may be the spherical shape or the approximately spherical shape.

From the viewpoints of dispersibility, filling properties, and mixability with flake-shaped micro particles, an aspect ratio of the sub-micro copper particles may be 5 or less, or 3 or less. In this specification, the "aspect ratio" represents a ratio of a long side/thickness of particles. The long side and the thickness of particles can be measured and obtained, for example, from a SEM image of particles.

The sub-micro copper particles may be treated with a specific surface treatment agent. Examples of the specific surface treatment agent include an organic acid having 8 to 16 carbon atoms. Examples of the organic acid having 8 to 16 carbon atoms include saturated patty acids such as caprylic acid, methylheptanoic acid, ethylhexanoic acid, propylpentanoic acid, pelargonic acid, methyloctanoic acid, ethylheptanoic acid, propylhexanoic acid, capric acid, methylnonanoic acid, ethyloctanoic acid, propylheptanoic acid, butylhexanoic acid, undecanoic acid, methyldecanoic acid, ethyl nonanoic acid, propyloctanoic acid, butylheptanoic acid, lauric acid, methylundecanoic acid, ethyldecanoic acid, propylnonanoic acid, butyloctanoic acid, pentylheptanoic acid, tridecanoic acid, methyldodecanoic acid, ethyl undecanoic acid, propyldecanoic acid, butylnonanoic acid, pentyloctanoic acid, myristic acid, methyltridecanoic acid, ethyldodecanoic acid, propylundecanoic acid, butyldecanoic acid, pentylnonanoic acid, hexyloctanoic acid, pentadecanoic acid, methyltetradecanoic acid, ethyltridecanoic acid, propyldodecanoic acid, butyl undecanoic acid, pentyldecanoic acid, hexylnonanoic acid, palmitic acid, methylpentadecanoic acid, ethyltetradecanoic acid, propyltridecanoic acid, butyldodecanoic acid, pentylundecanoic acid, hexyldecanoic acid, heptylnonanoic acid, methyl cyclohexane carboxylic acid, ethyl cyclohexane carboxylic acid, propyl cyclohexane carboxylic acid, butyl cyclohexane carboxylic acid, pentyl cyclohexane carboxylic acid, hexyl cyclohexane carboxylic acid, heptyl cyclohexane carboxylic acid, octyl cyclohexane carboxylic acid, and nonyl cyclohexane carboxylic acid; unsaturated patty acid such as octenoic acid, nonenoic acid, methylnonenoic acid, decenoic acid, undecenoic acid, dodecenoic acid, tridecenoic acid, tetradecenoic acid, myristoleic acid, pentadecenoic acid, hexadecenoic acid, palmitoleic acid, and sabic acid; and aromatic carboxylic acids such as terephthalic acid, pyromellitic acid, o-phenoxybenzoic acid, methylbenzoic acid, ethylbenzoic acid, propylbenzoic acid, butylbenzoic acid, pentylbenzoic acid, hexylbenzoic acid, heptylbenzoic acid, octylbenzoic acid, and nonylbenzoic acid. The organic acids may be used alone or in combination of two or more kinds thereof. When the organic acids and the sub-micro copper particles are combined, there is a tendency that dispersibility of the sub-micro copper particles and removal properties of the organic acids in sintering are compatible with each other.

A treatment amount of the surface treatment agent may an amount in which one molecular layer to three molecular layers adhere to a surface of the sub-micro copper particles. The amount can be calculated from the number of molecular layers (n) adhered to a surface of the sub-micro copper particles, a specific surface area ($A_p$) (unit: m$^2$/g) of the sub-micro copper particles, the molecular weight ($M_s$) (unit: g/mol) of the surface treatment agent, a minimum covering area ($S_S$) (unit: m$^2$/piece) of the surface treatment agent, and Avogadro's number ($N_A$) ($6.02 \times 10^{23}$). Specifically, the treatment amount of the surface treatment agent is calculated in accordance with the following expression.

$$\text{The treatment amount of the surface treatment agent (\% by mass)} = \{(n \cdot A_p \cdot M_s)/(S_S \cdot N_A + n \cdot A_p \cdot M_s)\} \times 100\%$$

The specific surface area of the sub-micro copper particles can be calculated by measuring the sub-micro copper particles which are dried with a BET specific surface area measurement method. In a case where the surface treatment agent is a straight-chain saturated patty acid, the minimum covering area of the surface treatment agent is $2.05 \times 10^{-19}$ m$^2$/one molecular. In the case of the other surface treatment agents, for example, the minimum covering area can be measured through calculation from a molecular model, or by a method described in "Chemical and Education" (UEDA KATSUHIRO, INAFUKU SUMIO, and MORI IWAO, 40(2), 1992, pages 114 to 117. An example of a quantitative method of the surface treatment agent will be described. The surface treatment agent can be identified by a thermal desorption gas and gas chromatography mass analyzer of a dry powder obtained by removing the dispersion medium from the copper paste for joining, and according to this, it is possible to determine the number of carbons and the molecular weight of the surface treatment agent. A carbon content ratio of the surface treatment agent can be analyzed through carbon content analysis. Examples of the carbon content analysis method include a high-frequency induction heating furnace combustion and infrared absorption method. The amount of the surface treatment agent can be calculated from the number of carbons, the molecular weight, and the carbon content ratio of the surface treatment agent that is identified in accordance with the above-described expression.

The treatment amount of the surface treatment agent may be 0.07% by mass to 2.1% by mass, 0.10% by mass to 1.6% by mass, or 0.2% by mass to 1.1% by mass.

As the sub-micro copper particles according to this embodiment, commercially available sub-micro copper particles can be used. Examples of the commercially available sub-micro copper particles include CH-0200 (manufactured by MITSUI MINING & SMELTING CO., LTD., volume-average particle size: 0.36 μm), HT-14 (manufactured by MITSUI MINING & SMELTING CO., LTD., volume-average particle size: 0.41 μm), CT-500 (manufactured by MITSUI MINING & SMELTING CO., LTD., volume-average particle size: 0.72 μm), and Tn-Cu100 (manufactured by TAIYO NIPPON SANSO CORPORATION, volume-average particle size: 0.12 μm).

(Flake-Shaped Micro Copper Particles)

Examples of the flake-shaped micro copper particles include micro copper particles including copper particles having a maximum particle size of 1 μm to 20 μm and an aspect ratio of 4 or greater are included. For example, copper particles having an average maximum particle size is 1μ to 20 μm and an aspect ratio of 4 or greater can be used. When an average maximum particle size and the aspect ratio of the flake-shaped micro copper particles are within the above-described range, it is possible to sufficiently reduce volume shrinkage when sintering the copper paste for joining, and it is easy to form the sintered metal layer according to this embodiment. From the viewpoint of further obtaining the above-described effect, the average maximum particle size of the flake-shaped micro copper particles may be 1 μm to 10 μm, or 3 μm to 10 μm. The maximum particle size and the average maximum particle size of the flake-shaped micro copper particles can be measured, for example, from a SEM image of particles, and are obtained as a major axis X of the flake-shaped structure, and an average value Xav of the major axis to be described later.

The flake-shaped micro copper particles can include copper particles having a maximum particle size of 1 μm to 20 μm in an amount of 50% by mass or greater. From the viewpoints of orientation in a joined body, a reinforcing effect, and filling properties of joining paste, the flake-shaped micro copper particles can include copper particles having a maximum particle size of 1 μm to 20 μm in an amount of 70% by mass or greater, 80% by mass or greater, or 100% by mass. From the viewpoint of suppressing joining failure, for example, it is preferable that the flake-shaped micro copper particles do not include particles, which has a size greater than a joining thickness, such as particles having the maximum particle size greater than 20 μm.

A method for calculating the major axis X of the flake-shaped micro copper particles from a SEM image will be exemplified. A powder of the flake-shaped micro copper particles is placed on a carbon tape for SEM by using a spatula, and is set as a sample for SEM. The sample for SEM is observed by a SEM apparatus at a magnification of 5000 times. A rectangle that is circumscribed to a flake-shaped micro copper particle on the SEM image is drawn by using image processing software, and a long side of the rectangle is set as the major axis X of the particle. The measurement is performed with respect to 50 or greater flake-shaped micro copper particles by using a plurality of SEM images, and the average value Xav of the major axis is calculated.

In the flake-shaped micro copper particles, the aspect ratio may be 4 or greater, or 6 or greater. When the aspect ratio is within the above-described range, the flake-shaped micro copper particles in the copper paste for joining are oriented in approximately parallel to a joining surface, and thus it is possible to suppress volume shrinkage when sintering the copper paste for joining, and it is easy to form the sintered metal layer according to this embodiment.

The amount of the flake-shaped micro copper particles contained may be 1% by mass to 90% by mass, 10% by mass to 70% by mass, or 20% by mass to 50% by mass on the basis of a total mass of metal particles. When the amount of the flake-shaped micro copper particles contained is within the above-described range, it is easy to form the sintered metal layer according to this embodiment.

The sum of the amount of the sub-micro copper particles contained and the amount of flake-shaped micro copper particles contained may be 80% by mass or greater on the basis of the total mass of the metal particles. When the sum of the amount of the sub-micro copper particles contained and the amount of the flake-shaped micro copper particles contained is within the above-described range, it is easy to form the sintered metal layer according to this embodiment. From the viewpoint of further obtaining the above-described effect, the sum of the amount of the sub-micro copper particles contained and the amount of the flake-shaped micro copper particles contained may be 90% by mass or greater, 95% by mass or greater, or 100% by mass on the basis of the total mass of the metal particles.

With regard to the flake-shaped micro copper particles, there is no particular limitation as to whether or not to perform treatment with a surface treatment agent. From the viewpoints of dispersion stability and oxidation resistance, the flake-shaped micro copper particles may be treated with the surface treatment agent. The surface treatment agent may be removed during joining Example of the surface treatment agent include aliphatic carboxylic acids such as palmitic acid, stearic acid, arachidic acid, and oleic acid; aromatic carboxylic acids such as terephthalic acid, pyromellitic acid, and o-phenoxybenzoic acid; aliphatic alcohols such as cetyl alcohol, stearyl alcohol, isobornyl cyclohexanol, tetraethylene glycol; aromatic alcohols such as p-phenyl phenol; alkylamines such as octylamine, dodecylamine, and stearylamine; alphatic nitriles such as stearonitrile and decanitrile; silane coupling agents such as alkylalkoxysilane; polymer treatment agents such as polyethylene glycol, polyvinyl alcohol, polyvinyl pyrrolidone, and silicone oligomer; and the like. The surface treatment agents may be used alone or in combination of two or more kinds thereof.

The treatment amount of the surface treatment agent may be set to an amount corresponding to one molecular layer or more on a particle surface. The treatment amount of the surface treatment agent varies due to a specific surface area of the flake-shaped micro copper particles, the molecular weight of the surface treatment agent, and a minimum covering area of the surface treatment agent. The treatment amount of the surface treatment agent is typically 0.001% by mass or greater. The specific surface area of the flake-shaped micro copper particles, the molecular weight of the surface treatment agent, and the minimum covering area of the surface treatment agent can be calculated by the above-described methods.

In the case of preparing the copper paste for joining with the sub-micro copper particles alone, volume shrinkage and sintering shrinkage along with drying of the dispersion medium are great, and thus the copper paste for joining is likely to be peeled off from a joining surface during sintering of the copper paste for joining, and thus it is difficult to obtain sufficient die shear strength and connection reliability in joining of a semiconductor element and the like. When the sub-micro copper particles and the flake-shaped micro copper particles are used in combination, volume shrinkage when sintering the copper paste for joining is suppressed, and it is easy to form the sintered metal layer according to this embodiment.

In the copper paste for joining of this embodiment, it is preferable that the amount of the micro copper particles, which are included in the metal particles, and have a maximum particle size of 1 μm to 20 μm and an aspect ratio of less than 2, is 50% by mass or less, and preferably 30% by mass or less on the basis of a total amount of the flake-shaped micro copper particles having the maximum particle size of 1 μm to 20 μm and an aspect ratio of 4 or greater. When the amount of the micro copper particles having the average maximum particle size of 1 μm to 20 μm and the aspect ratio of less than 2 is limited, the flake-shaped micro copper particles in the copper paste for joining are likely to be oriented in approximately parallel to a joining surface, and thus it is possible to effectively suppress volume shrinkage when sintering the copper paste for joining. According to this, it is easy to form the sintered metal layer according to this embodiment. From the viewpoint capable of further easily obtaining the effect, the amount of the micro copper particles having the average maximum particle size of 1 μm to 20 μm and the aspect ratio of less than 2 may be 20% by mass or less, or 10% by mass on the basis of a total amount of the flake-shaped micro copper particles having the maximum particle size of 1 μm to 20 μm and the aspect ratio of 4 or greater.

As the flake-shaped micro copper particles according to this embodiment, commercially available flake-shaped micro copper particles can be used. Examples of the commercially available flake-shaped micro copper particles include MA-C025 (manufactured by MITSUI MINING & SMELTING CO., LTD., average maximum particle size: 4.1 μm), 3L3 (manufactured by FUKUDA METAL FOIL & POWDER CO., LTD., volume maximum particle size: 7.3 μm), 1110F (manufactured by MITSUI MINING & SMELTING CO., LTD., average maximum particle size: 5.8 μm), and 2L3 (manufactured by FUKUDA METAL FOIL & POWDER CO., LTD., average maximum diameter: 9 μm).

In the copper paste for joining of this embodiment, as the micro copper particles which are blended, micro copper particles, which include flake-shape micro copper particles having a maximum particle size of 1 μm to 20 μm and an aspect ratio of 4 or greater, and in which the amount of micro copper particles having a maximum particle size of 1 μm to 20 μm and an aspect ratio of less than 2 is 50% by mass or less, and preferably 30% by mass or less on the basis of a total amount of the flake-shaped micro copper particles, can be used. In the case of using the commercially available flake-shaped micro copper particles, flake-shaped micro copper particles, which include flake-shaped micro copper particles having a maximum particle size of 1 μm to 20 μm and an aspect ratio of 4 or greater, and in which the amount of micro copper particles having a maximum particle size of 1 μm to 20 μm and an aspect ratio of less than 2 is 50% by mass or less on the basis of a total amount of the flake-shaped micro copper particles, and preferably 30% by mass or less, may be selected.

(Other Metal Particles Other than Copper Particles)

As the metal particles, other metal particles other than the sub-micro copper particles and the micro copper particles may be included. For example, particles of nickel, silver, gold, palladium, platinum, and the like may be included. The other metal particles may have a volume-average particle size of 0.01 μm to 10 μm, 0.01 μm to 5 μm, or 0.05 μm to 3 μm. In a case where the other metal particles are included, the amount of the metal particles contained may be less than 20% by mass, or 10% by mass or less on the basis of the total mass of the metal particles from the viewpoint of obtaining sufficient joining properties. The other metal particles may not be included. A shape of the other metal particles is not particularly limited.

When the other metal particles other than the copper particles are included, it is possible to obtain a sintered metal layer in which a plurality of kinds of metals are solid-soluted or dispersed, and thus mechanical characteristics such as a yield stress and fatigue strength of the sintered metal layer are improved, and thus connection reliability is likely to be improved. In addition, the plurality of kinds of metal particles are added, in the sintered metal layer that is formed, joining strength and connection reliability of a semiconductor device are likely to be improved with respect to a specific adherend.

(Dispersion Medium)

The dispersion medium is not particularly limited, and a volatile dispersion medium is also possible. Examples of the volatile dispersion medium include monohydric or polyhydric alcohols such as pentanol, hexanol, heptanol, octanol, decanol, ethylene glycol, diethylene glycol, propylene glycol, butylene glycol, α-terpineol, and isobornyl cyclohexanol (MTPH); ethers such as ethylene glycol butyl ether, ethylene glycol phenyl ether, diethylene glycol methyl ether, diethylene glycol ethyl ether, diethylene glycol butyl ether, diethylene glycol isobutyl ether, diethylene glycol hexyl ether, triethylene glycol methyl ether, diethylene glycol dimethyl ether, diethylene glycol diethyl ether, diethylene glycol dibutyl ether, diethylene glycol butyl methyl ether, diethylene glycol isopropyl methyl ether, triethylene glycol dimethyl ether, triethylene glycol butyl methyl ether, propylene glycol propyl ether, dipropylene glycol methyl ether, dipropylene glycol ethyl ether, dipropylene glycol propyl ether, dipropylene glycol butyl ether, dipropylene glycol dimethyl ether, tripropylene glycol methyl ether, and tripropylene glycol dimethyl ether; esters such as ethylene glycol ethyl ether acetate, ethylene glycol butyl ether acetate, diethylene glycol ethyl ether acetate, diethylene glycol butyl ether acetate, dipropylene glycol methyl ether acetate (DPMA), ethyl lactate, butyl lactate, γ-butyrolactone, and propylene carbonate; acid amids such as N-methyl-2-pyrrolidone, N,N-dimethylacetamide, and N,N-dimethylformamide; aliphatic hydrocarbon such as cyclohexanone, octane, nonane, decane, and undecane; aromatic hydrocarbon such as benzene, toluene, and xylene; mercaptans having an alkyl group having 1 to 18 carbon atoms; and mercaptans having a cycloalkyl group having 5 to 7 carbon atoms. Examples of the mercaptans having an alkyl group having 1 to 18 carbon atoms include ethyl mercaptan, n-propyl mercaptan, i-propyl mercaptan, n-butyl mercaptan, i-butyl mercaptan, t-butyl mercaptan, pentyl mercaptan, hexyl mercaptan, and dodecyl mercaptan. Examples of the mercaptans having a cycloalkyl group having 5 to 7 carbon atoms include cyclopentyl mercaptan, cyclohexyl mercaptan, and cycloheptyl mercaptan.

The amount of the dispersion medium contained may be 5 to 50 parts by mass when the total mass of the metal particles is set to 100 parts by mass. When the amount of the dispersion medium contained is within the above-described range, it is possible to adjust the copper paste for joining to have appropriate viscosity, and sintering of the copper paste is less likely to be obstructed.

(Additive)

A wetting improving agent such as a non-ionic surfactant and a fluorine-based surfactant; a defoaming agent such as silicone oil; an ion trapping agent such as an inorganic ion exchanger; and the like may be appropriately added to the copper paste for joining as necessary.

(Preparation of Copper Paste for Joining)

The copper paste for joining may be prepared by mixing the sub-micro copper particles, the micro copper particles, the other metal particles, and an arbitrary additive to the dispersion medium. After mixing of the respective components, a stirring process may be performed. In the copper paste for joining, a maximum particle size of a dispersed solution may be adjusted by a classification operation.

The copper paste for joining may be prepared as follows. Specifically, the sub-micro copper particles, the surface treatment agent, and the dispersion medium are mixed with each other in advance, and a dispersing treatment is performed to prepare a dispersed solution of the sub-micro copper particles. Then, the micro copper particles, the other metal particles, and an arbitrary additive are added to the dispersed solution. According to this procedure, dispersibility of the sub-micro copper particles is improved, and mixability with the micro copper particles is enhanced, and thus the performance of the copper paste for joining is further improved. The dispersed solution of the sub-micro copper particles may be subjected to a classification operation to remove an aggregate.

<Semiconductor Device, and Method for Manufacturing Semiconductor Device>

A semiconductor device of this embodiment includes a first member, a second member, and a sintered metal layer that joins the first member and the second member. At least one of the first member and the second member is a semiconductor element. The sintered metal layer has a predetermined orientation structure, and the amount of copper contained in the sintered metal layer is 65% by volume or greater on the basis of a volume of the sintered metal layer.

Examples of the semiconductor element include power modules including a diode, a rectifier, a thyristor, a MOS gate driver, a power switch, a power MOSFET, an IGBT, a Schottky diode, a fast recovery diode, and the like, a transmitter, an amplifier, an LED module, and the like. Examples of members other than the semiconductor element include a base material for semiconductor element mounting such as a lead frame, a metal plate-attached ceramic substrate (for example, DBC), and an LED package, a copper ribbon, a metal block, a power supply member such as a terminal, a heat dissipation plate, a water cooling plate, and the like.

The sintered metal layer in this embodiment can be set to have the same configuration as that of the sintered metal layer in the joined body of this embodiment.

In the semiconductor device of this embodiment, from the viewpoints of the subsequent process compatibility and connection reliability, the die shear strength may be 10 MPa or greater, 15 MPa or greater, 20 MPa or greater, or 30 MPa or greater. The die shear strength can be measured by using a full-universal type bond glue tester (4000 series, manufactured by DAGE corporation), and the like.

Figure 5:
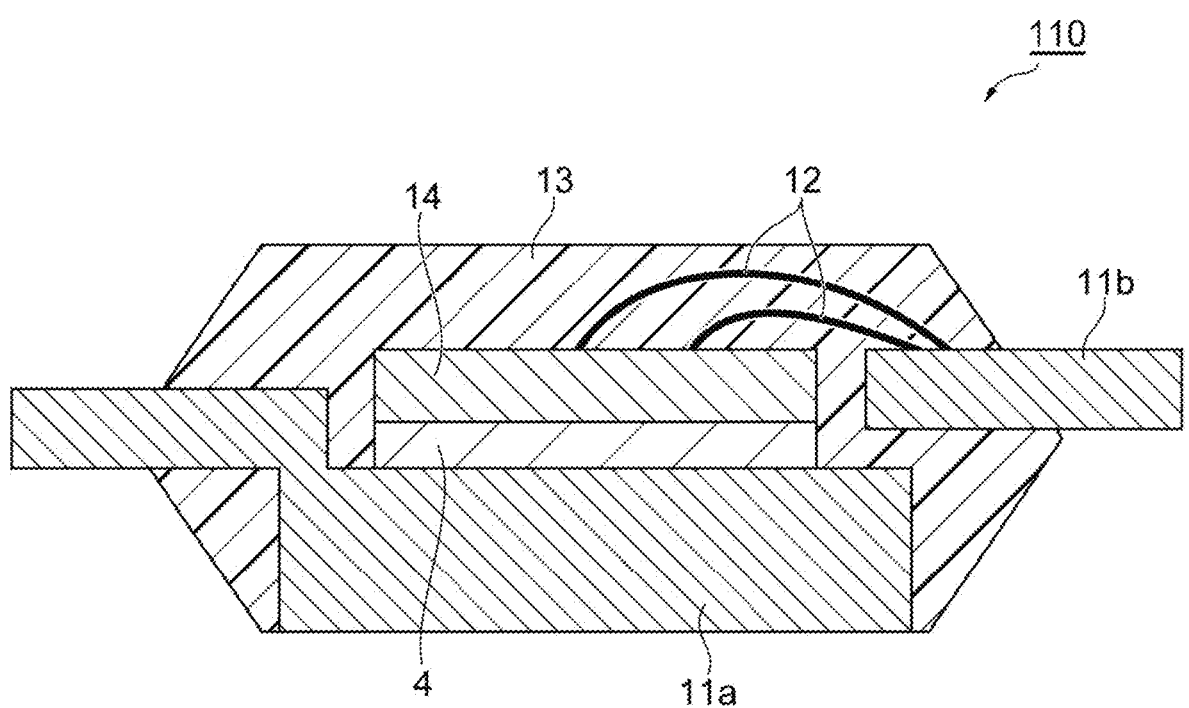
FIG. 5 is a schematic cross-sectional view illustrating an example of a semiconductor device that is manufactured by using the copper paste for joining of this embodiment.

FIG. 5 is a schematic cross-sectional view illustrating an example of the semiconductor device of this embodiment. A semiconductor device 110 illustrated in FIG. 5 includes a semiconductor element 14 that is connected onto a lead frame 11a through the sintered metal layer 4, and a mold resin 13 that molds the resultant laminated body. The semiconductor element 14 is connected to a lead frame 11b through a wire 12.

Examples of a semiconductor device that is manufactured by using the copper paste for joining of this embodiment include power modules including a diode, a rectifier, a thyristor, a MOS gate driver, a power switch, a power MOSFET, an IGBT, a Schottky diode, a fast recovery diode and the like, a transmitter, an amplifier, a high-brightness LED module, a sensor, and the like.

The semiconductor device of this embodiment has high connection reliability at a high-temperature operation, improved heat dissipation due to high thermal conductivity, and high electric conductivity, and thus can be preferably used as a semiconductor device that uses a high heat dissipation semiconductor element, a semiconductor device that operates in a high temperature environment, and the like.

The semiconductor device can be manufactured by the same method as in manufacturing of the joined body. That is, examples of the method of manufacturing the semiconductor device includes a method including a process of preparing a laminated body in which the first member, and the copper paste for joining and the second member, which are disposed on a side on which own weight of the first member acts, are laminated in this order, and at least one of the first member and the second member is a semiconductor element, and sintering the copper paste for joining in a state of receiving the own weight of the first member, or the own weight of the first member and a pressure of 0.01 MPa or lower.

According to the method, in a case where the second member is a semiconductor element, it is possible to reduce damage to the semiconductor element when joining a metal interconnection, a block body, and the like as the first member to the semiconductor element. A semiconductor device in which a member such as the metal interconnection, the block body, or the like is joined onto the semiconductor element will be described below.

As an embodiment of the semiconductor device, the following semiconductor device can be exemplified. Specifically, the semiconductor device includes a first electrode, a semiconductor element that is electrically connected to the first electrode, and a second electrode that is electrically connected to the semiconductor element through a metal interconnection. A sintered metal layer is provided between the semiconductor element and the metal interconnection, and between the metal interconnection and the second electrode.

Figure 6:
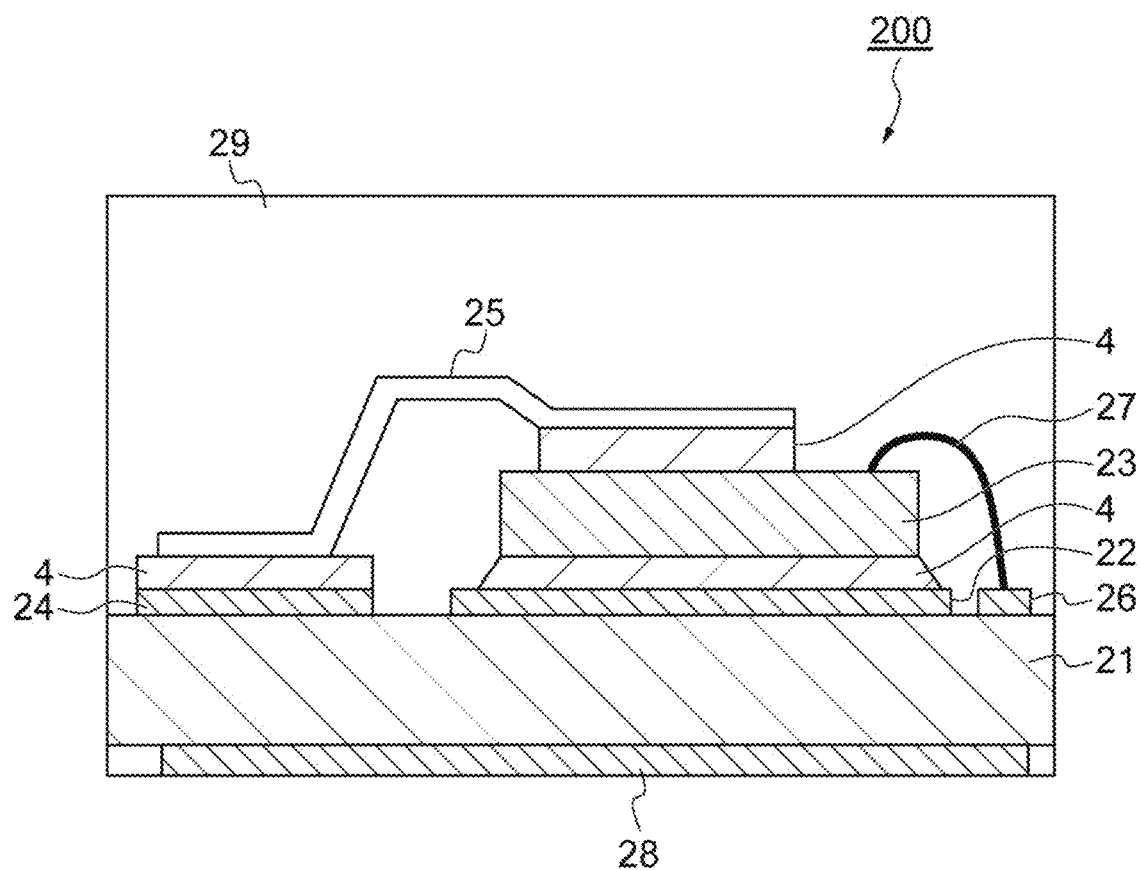
FIG. 6 is a schematic cross-sectional view illustrating an example of the semiconductor device that is manufactured by using the copper paste for joining of this embodiment.

FIG. 6 is a schematic cross-sectional view illustrating an example of the semiconductor device. A semiconductor device 200 illustrated in FIG. 6 includes an insulating substrate 21 provided with a first electrode 22 and a second electrode 24, a semiconductor element 23 that is joined onto the first electrode 22 by the sintered metal layer 4, and a metal interconnection 25 that electrically connects the semiconductor element 23 and the second electrode 24. Between the metal interconnection 25 and the semiconductor element 23, and between the metal interconnection 25 and the second electrode 24 are respectively joined by the sintered metal layer 4. In addition, the semiconductor element 23 is connected to a third electrode 26 through a wire 27. The semiconductor device 200 is provided with a copper plate 28 on a side, which is opposite to a surface on which the electrodes and the like are mounted, of the insulating substrate 21. In the semiconductor device 200, the structure body is sealed with an insulator 29. The semiconductor device 200 includes one piece of the semiconductor element 23 on the first electrode 22, but two or more pieces of the semiconductor elements 23 may be provided. In this case, a plurality of the semiconductor elements 23 can be respectively joined to the metal interconnection 25 by the sintered metal layer 4.

Figure 7:
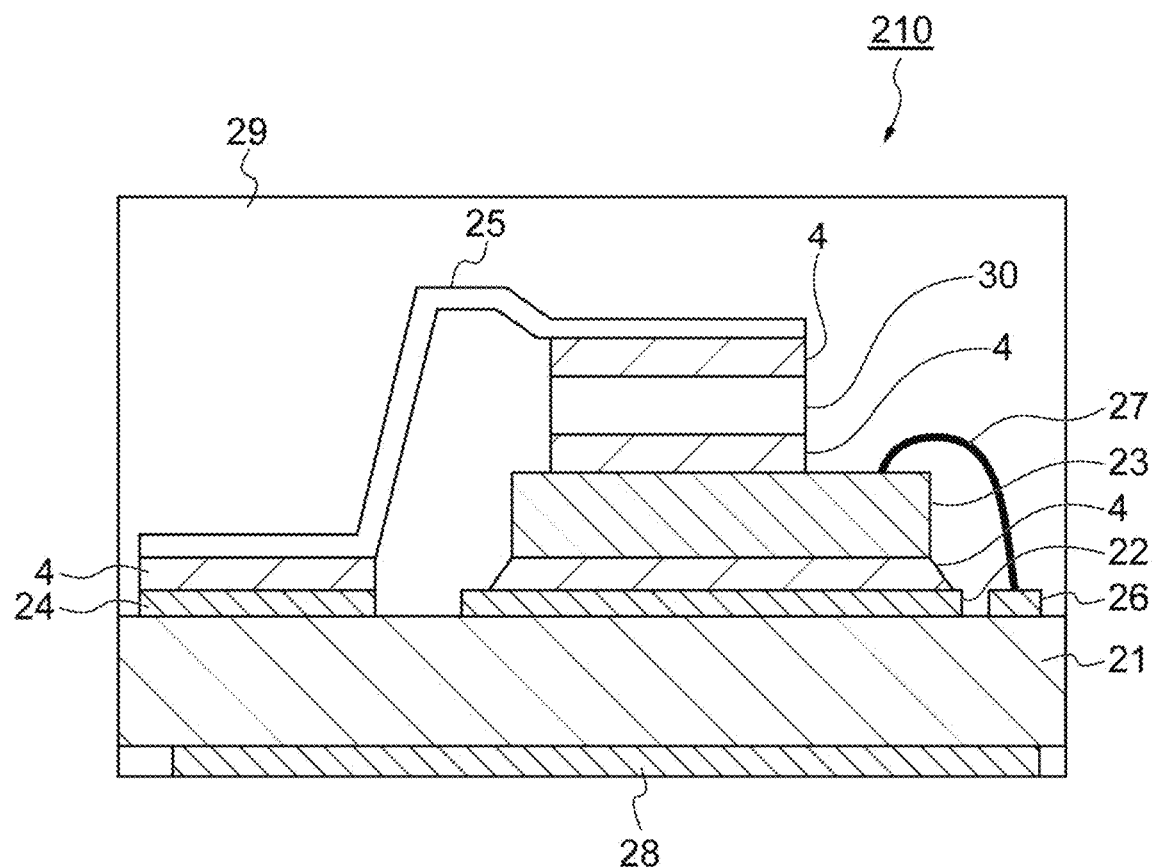
FIG. 7 is a schematic cross-sectional view illustrating an example of the semiconductor device that is manufactured by using the copper paste for joining of this embodiment.

FIG. 7 is a schematic cross-sectional view illustrating another example of the semiconductor device. A semiconductor device 210 illustrated in FIG. 7 has the same configuration as in the semiconductor device 200 illustrated in FIG. 6 except that a block body 30 is provided between the semiconductor element 23 and the metal interconnection 25, and between the semiconductor element 23 and the block body 30 and between the block body 30 and the metal interconnection 25 are respectively joined by the sintered metal layer 4. Furthermore, a position of the block body 30 can be appropriately changed, and may be provided between the first electrode 22 and the semiconductor element 23 as an example.

Figure 8:
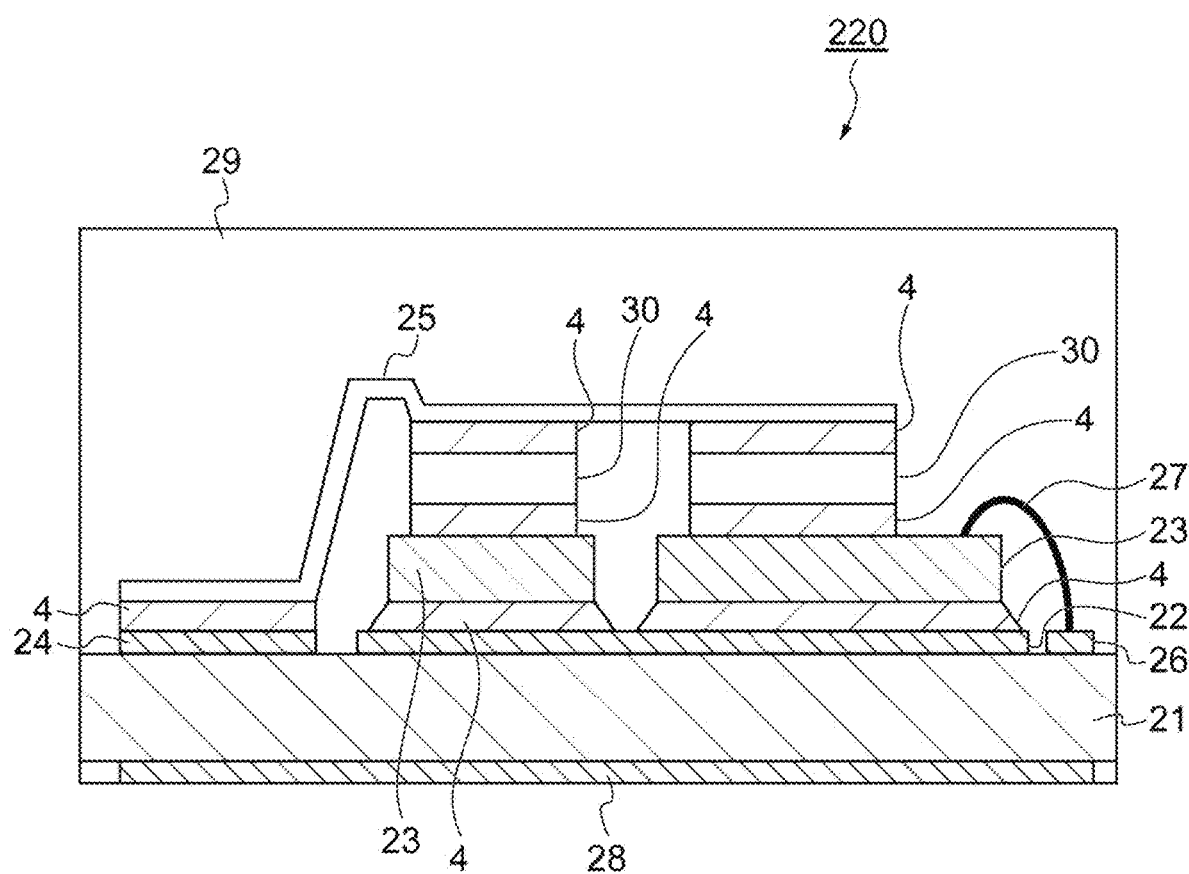
FIG. 8 is a schematic cross-sectional view illustrating an example of the semiconductor device that is manufactured by using the copper paste for joining of this embodiment.

FIG. 8 is a schematic cross-sectional view illustrating still another example of the semiconductor device. A semiconductor device 220 illustrated in FIG. 8 has the same configuration as in the semiconductor device 210 illustrated in FIG. 7 except that the sintered metal layer 4, which is parallel to the semiconductor element 23 and the block body 30, is further provided over the first electrode 22 to respectively join the first electrode 22, the semiconductor element 23, and the block body 30. The semiconductor device 220 includes two pieces of the semiconductor elements on the first electrode 22, but three or more pieces of the semiconductor elements may be provided. Even in this case, the three or more semiconductor elements 23 can be respectively joined to the metal interconnection 25 by the sintered metal layer 4 through the block body 30. Furthermore, a position of the block body 30 can be appropriately changed, and may be provided between the first electrode 22 and the semiconductor element 23 as an example.

Examples of the insulating substrate 21 include ceramic such as alumina, aluminum nitride, and silicon nitride, a highly thermal conductive particle/resin composite, a polyimide resin, a polymaleimide resin, and the like.

Examples of the metal that constitutes the first electrode 22, the second electrode 24, and the third electrode 26 include copper, nickel, silver, gold, palladium, platinum, lead, tin, cobalt, and the like. The metals can be used alone or in combination of two or more kinds thereof. In addition, the electrodes may include an alloy, which contains the metals, on a surface that is in contact with the sintered metal layer 4. Examples of the metal that can be used in the alloy include zinc, manganese, aluminum, beryllium, titanium, chromium, iron, molybdenum, and the like other than the above-described metals.

Examples of the metal interconnection include a metal frame having a shape such as a strip shape, a plate shape, a cubic shape, a cylindrical shape, an L-shape, and a ⊐-shape, and a Λ-shape, and the like. Examples of a material of the metal interconnection include silver, copper, iron, aluminum, molybdenum, tungsten, tantalum, niobium, or an alloy thereof. A surface of the metal interconnection may be coated with nickel, copper, gold, silver, and the like through plating, sputtering, and the like for oxidation resistance and adhesiveness. In addition, the metal interconnection may have a width of 1 μm to 30 μm, and a thickness of 20 μm to 5 mm.

It is preferable that the block body has excellent thermal conductivity and electric conductivity, and for example, silver, copper, iron, aluminum, molybdenum, tungsten, tantalum, niobium, or an alloy thereof can be used as the block body. A surface of the block body may be coated with nickel, copper, gold, silver, and the like through plating, sputtering, and the like for oxidation resistance and adhesiveness. When the block body is provided on the semiconductor element, heat dissipation is further improved. The number of the block body can be appropriately changed.

Examples of the insulator 29 include a silicone gel, a polymaleimide resin, a polyimide resin, a polyamideimide resin, and the like.

The sintered metal layer 4 is obtained by sintering the above-described copper paste for joining. The sintered metal layer 4 may be in contact with the metal interconnection 25, and may include a structure derived from flake-shaped copper particles which are oriented in approximately parallel to an interface with the metal interconnection 25, and the amount of copper contained in the sintered metal layer 4 may be 65% by volume or greater on the basis of a volume of the sintered metal layer. In addition, in a case where the sintered metal layer 4 is in contact with the first electrode, the second electrode, the semiconductor element, or the block body, the sintered metal layer 4 may include a structure derived from flake-shaped copper particles which are oriented in approximately parallel to an interface with the first electrode, the second electrode, the semiconductor element, or the block body, and the amount of copper contained in the sintered metal layer 4 may be 65% by volume or greater on the basis of a volume of the sintered metal layer.

The semiconductor devices illustrated in FIGS. 6 to 8 can be used in a power module that is required to have high reliability at large capacity.

For example, the semiconductor device illustrated in FIGS. 6 to 8 can be manufactured by a method including a process of preparing an insulating substrate provided with a first electrode and a second electrode, providing copper paste for joining and a semiconductor element, and as necessary, copper paste for joining, a block body, and copper paste for joining on the first electrode in this order from the first electrode side, providing copper paste for joining on the second electrode, and disposing a metal interconnection on the copper paste for joining on the semiconductor element or the block body and on the copper paste for joining on the second electrode for crosslinkage of the copper paste for joining, and a process of sintering the copper paste for joining in a state of receiving own weight of the respective members, or the own weight of the respective members and a pressure of 0.01 MPa or less.

According to the manufacturing method, it is possible to manufacture a semiconductor device without pressurization. Accordingly, it is possible to perform joining without deforming the metal interconnection having a bridge portion, and it is possible to reduce damage for a semiconductor element even in the case of joining a member having an area smaller than that of the semiconductor element onto the semiconductor element.

Figure 9:
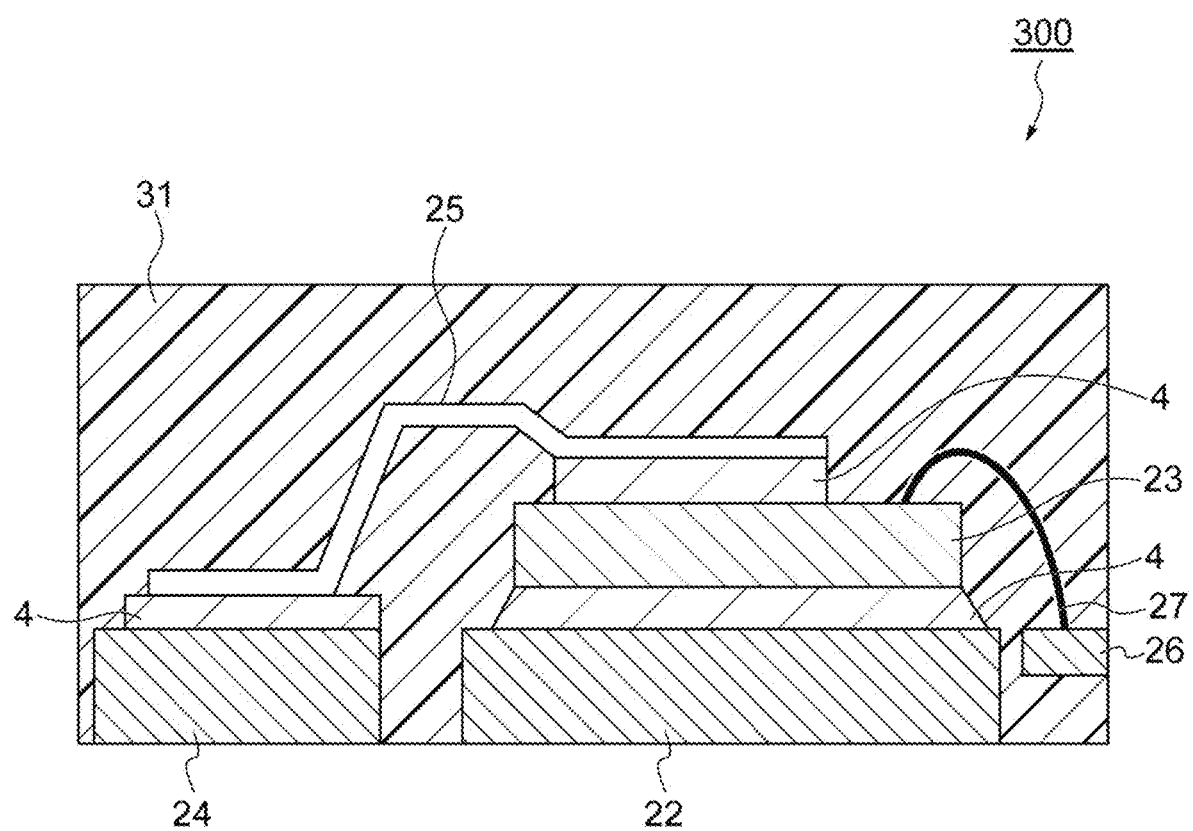
FIG. 9 is a schematic cross-sectional view illustrating an example of the semiconductor device that is manufactured by using the copper paste for joining of this embodiment.

FIG. 9 is a schematic cross-sectional view illustrating still another example of the semiconductor device. A semiconductor device 300 illustrated in FIG. 9 includes a first electrode 22, a semiconductor element 23 that is joined onto the first electrode 22 by the sintered metal layer 4, and a metal interconnection 25 that electrically connects the semiconductor element 23 and a second electrode 24. Between the metal interconnection 25 and the semiconductor element 23, and between the metal interconnection 25 and the second electrode 24 are joined by the sintered metal layer 4. In addition, the semiconductor element 23 is connected to the third electrode 26 through a wire 27. In the semiconductor device 300, the above-described structure body is sealed with a sealing material 31. The semiconductor device 300 includes one piece of the semiconductor element 23 on the first electrode 22, but two or more pieces of the semiconductor elements 23 may be provided. In this case, a plurality of the semiconductor elements 23 can be respectively joined to the metal interconnection 25 by the sintered metal layer 4.

Figure 10:
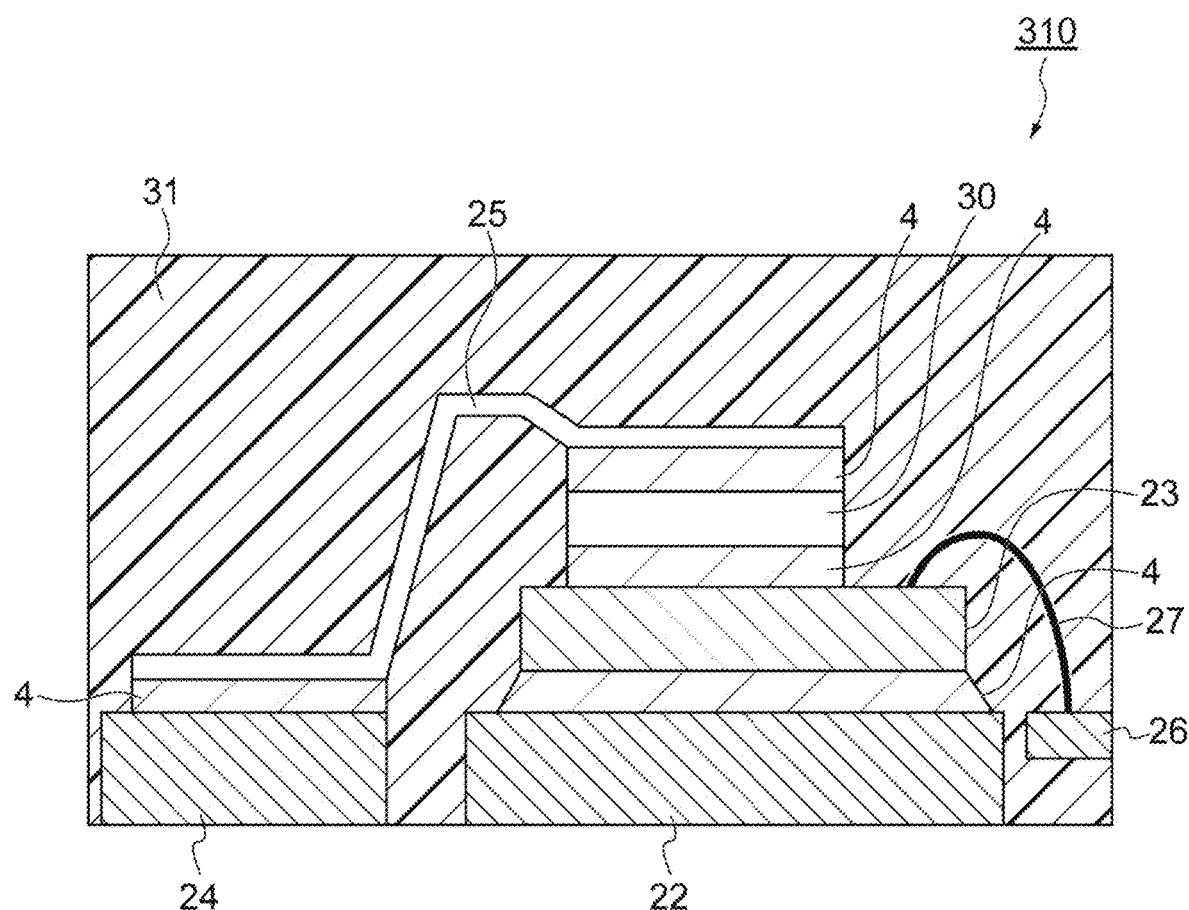
FIG. 10 is a schematic cross-sectional view illustrating an example of the semiconductor device that is manufactured by using the copper paste for joining of this embodiment.

FIG. 10 is a schematic cross-sectional view illustrating still another example of the semiconductor device. A semiconductor device 310 illustrated in FIG. 10 has the same configuration as in the semiconductor device 300 illustrated in FIG. 9 except that a block body 30 is provided between the semiconductor element 23 and the metal interconnection 25, and between the semiconductor element 23 and the block body 30, and between the block body 30 and the metal interconnection 25 are respectively joined by the sintered metal layer 4. Furthermore, a position of the block body 30 can be appropriately changed, and may be provided between the first electrode 22 and the semiconductor element 23 as an example.

Figure 11:
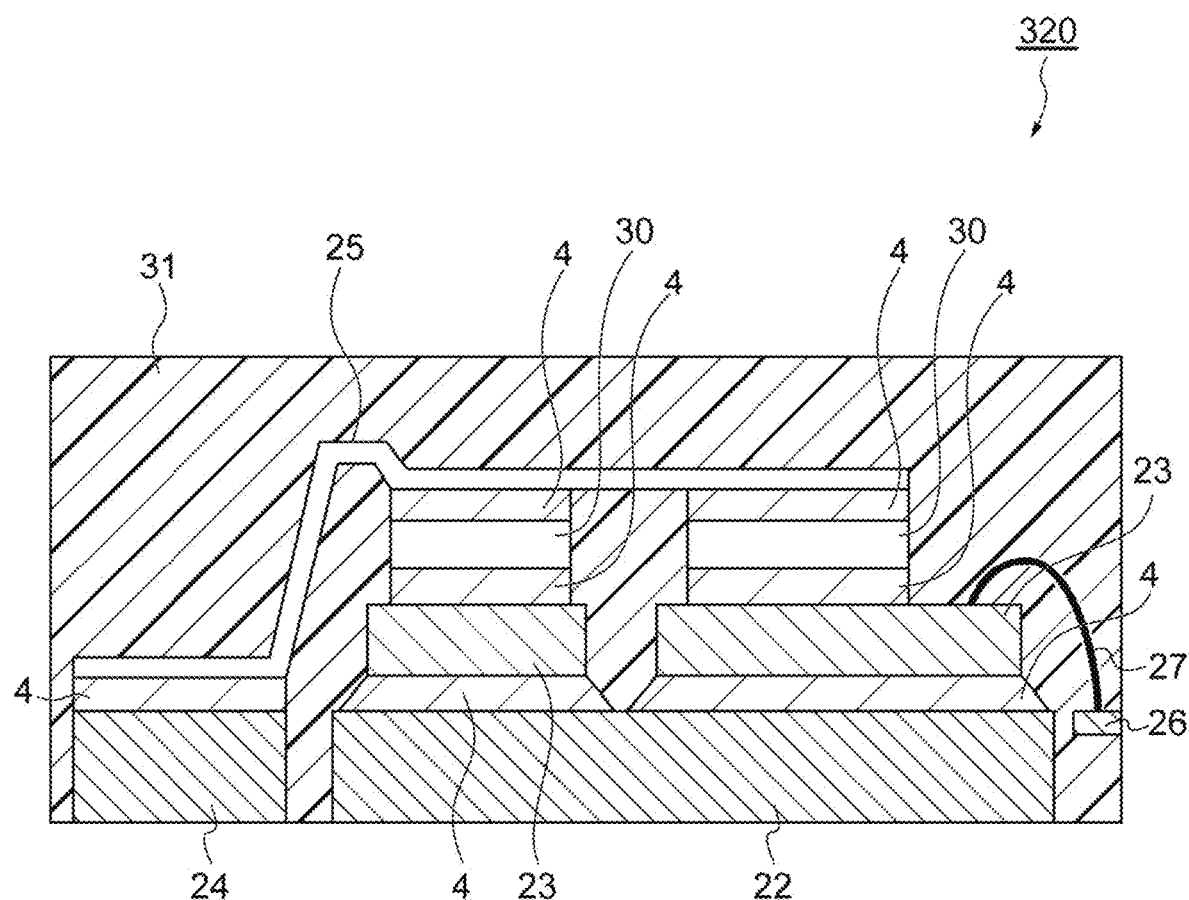
FIG. 11 is a schematic cross-sectional view illustrating an example of the semiconductor device that is manufactured by using the copper paste for joining of this embodiment.

FIG. 11 is a schematic cross-sectional view illustrating still another example of the semiconductor device. A semiconductor device 320 illustrated in FIG. 11 has the same configuration as in the semiconductor device 310 illustrated in FIG. 10 except that the sintered metal layer 4, which is parallel to the semiconductor element 23 and the block body 30, is further provided over the first electrode 22 to respectively join the first electrode 22, the semiconductor element 23, and the block body 30. The semiconductor device 320 includes two pieces of the semiconductor elements on the first electrode 22, but three or more pieces of the semiconductor elements may be provided. Even in this case, the three or more semiconductor elements 23 can be respectively joined to the metal interconnection 25 by the sintered metal layer 4 through the block body 30. Furthermore, a position of the block body 30 can be appropriately changed, and may be provided between the first electrode 22 and the semiconductor element 23 as an example.

The first electrode 22 and the second electrode 24 which are illustrated in FIGS. 9 to 11 may be a lead frame, a copper plate, a copper and molybdenum sintered body.

Examples of the sealing material 31 include heat-resistant solid sealing material, a highly thermal conductive composite, and the like.

The sintered metal layer 4 can be similar to the sundered body 1 described in the semiconductor devices 200 to 220.

When employing a lead frame and the like as the first electrode and the second electrode, the semiconductor device of the embodiment in FIGS. 9 to 11 can be used in a small-sized power module. The semiconductor devices can be manufactured in the same manner as in the above-described method for manufacturing the semiconductor device.

In addition, description will be given of still another example of the semiconductor device having a structure in which a block body is joined onto a semiconductor element.

As the semiconductor device, the following semiconductor device can be exemplified. Specifically, the semiconductor device includes a first thermal conduction member, a second thermal conduction member, and a semiconductor element that is disposed between the first thermal conduction member and the second thermal conduction member. A sintered metal layer including copper is provided at least one side between the first thermal conduction member and the semiconductor element, and between the semiconductor element and the second thermal conduction member.

Figure 12:
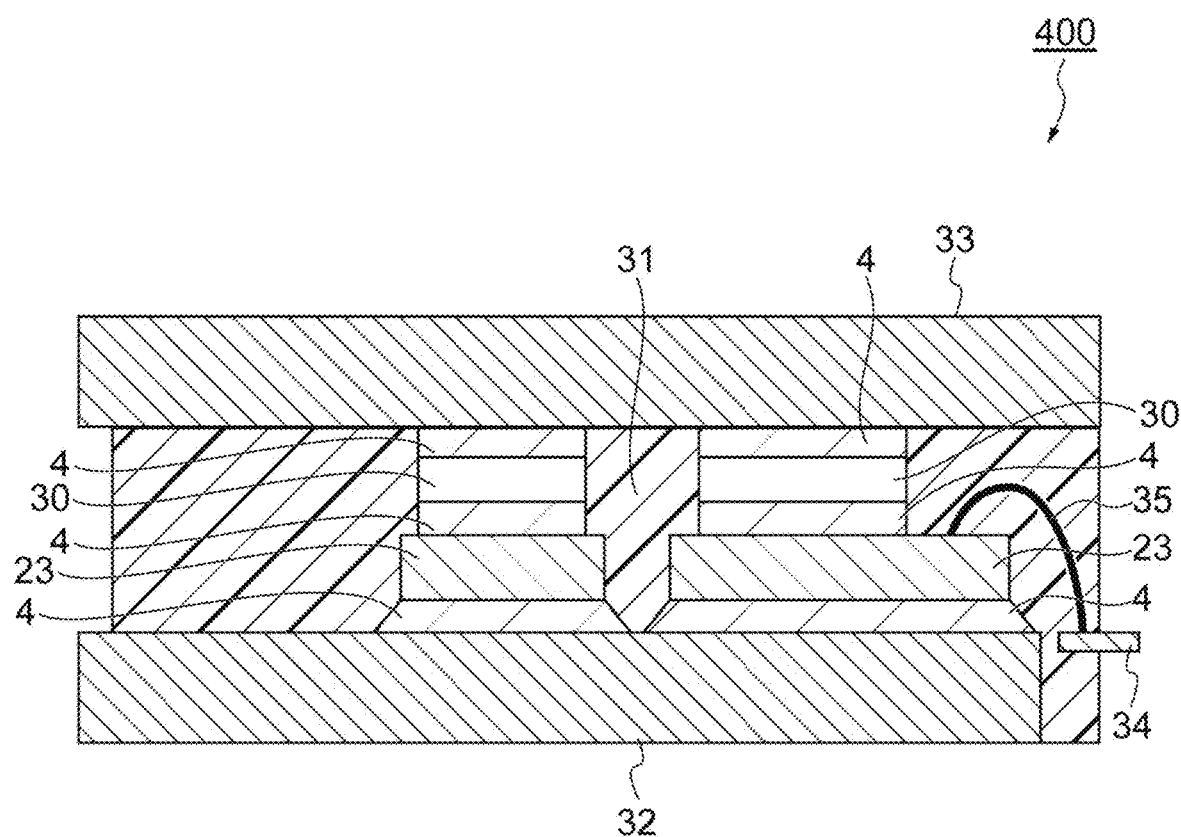
FIG. 12 is a schematic cross-sectional view illustrating an example of the semiconductor device that is manufactured by using the copper paste for joining of this embodiment.

FIG. 12 is a schematic cross-sectional view illustrating an example of this embodiment. A semiconductor device 400 illustrated in FIG. 12 includes a first thermal conduction member 32, a semiconductor element 23 that is joined onto the first thermal conduction member 32 through the sintered metal layer 4, a block body 30 that is joined onto the semiconductor element 23 through the sintered metal layer 4, and a second thermal conduction member 33 that is joined onto the block body 30 through the sintered metal layer 4 of the copper paste for joining. The semiconductor element 23 is connected to an electrode 34 through a wire 35. In the semiconductor device 400, a space between the first thermal conduction member 32 and the second thermal conduction member is sealed with a sealing material 31. The semiconductor device 400 includes two semiconductor elements. However, one or three or more semiconductor elements may be provided, and the number of the block body can be appropriately changed. Furthermore, a position of the block body 30 can be appropriately changed, and may be provided between the first electrode 22 and the semiconductor element 23 as an example.

The thermal conduction members have a function of emitting heat generated from the semiconductor element 23 to the outside, and a function as an electrode that electrically connects the semiconductor element to the outside. For example, copper, aluminum, and an alloy thereof can be used in the thermal conduction members.

The sintered metal layer 4 is obtained by sintering the above-described copper paste for joining. The sintered metal layer 4 may be in contact with the first thermal conduction member 32 or the second thermal conduction member 33, and may include a structure derived from flake-shaped copper particles which are oriented in approximately parallel to an interface with the first thermal conduction member 32 or the second thermal conduction member 33, and the amount of copper contained in the sintered metal layer 4 may be 65% by volume or greater on the basis of a volume of the sintered metal layer. In a case where the sintered metal layer 4 is in contact with the semiconductor element or the block body, the sintered metal layer 4 may include a structure derived from flake-shaped copper particles which are oriented in approximately parallel to an interface with the semiconductor element or the block body, and the amount of copper contained in the sintered metal layer 4 may be 65% by volume or greater on the basis of the volume of the sintered metal layer.

The semiconductor device illustrated in FIG. 12 includes the thermal conduction member on both sides of the semiconductor element. Accordingly, the semiconductor device can have a double-sided cooling structure excellent in heat dissipation. The semiconductor device can be manufactured by a method including a process of preparing a laminated body in which copper paste for joining, a semiconductor element, copper paste for joining, a block body, copper paste for joining, and a second thermal conduction member are laminated on a first thermal conduction member in this order from the first thermal conduction member side, and sintering the copper paste for joining in a state of receiving own weight of the respective members, or the own weight of the respective members and a pressure of 0.01 MPa or less. Furthermore, in the laminated body, lamination may be performed in reverse order.

EXAMPLES

Hereinafter, the invention will be described more specifically with reference to examples. However, the invention is not limited to the following examples.

<Measurement Conditions>

(1) Measurement of Die Shear Strength

A stainless steel metal mask, which has a thickness of 70 μm and include square openings of 3 mm×3 mm in 3 rows×3 columns, was placed on a copper plate (19×25×3 mm$^3$), the copper paste for joining was applied through stencil printing using a metal squeegee. A silicon chip (chip thickness: 600 μm), in which titanium and nickel were sequentially formed and a joining surface of 3×3 mm$^2$ was formed from nickel, was placed on the applied copper paste for joining, and the silicon chip was slightly pressed with a pincette. The resultant laminated body was set in a tube furnace (manufactured by AVC Co., Ltd), and an argon gas was allowed to flow at a flow rate of 1 L/min to substitute the air with the argon gas. Then, the laminated body was sintered under conditions of temperature rising for 10 minutes, 350° C., and 10 minutes while allowing a hydrogen gas to flow at a flow rate of 300 mL/min, thereby obtaining a joined body in which the copper plate and the silicon chip were joined with the sintered metal layer. Then, the flow rate of the argon gas was changed to 0.3 L/min, and cooling was performed. Then, the joined body, which was cooled down to 50° C. or lower was taken out into the air.

The joining strength of the joined body was evaluated by the die shear strength. The die shear strength was measured as follows. The silicon chip was pressed in a horizontal direction by using full-universal type bond glue tester (4000 series, manufactured by DAGE corporation) attached with 1 kN load cell at a measurement speed of 500 μm/s and a measurement height of 100 μm. An average value of values obtained by measuring eight joined bodies was set as the die shear strength.

(2) Amount (Volume Ratio) of Copper Contained in Sintered Metal Layer

An opening of 15×15 mm$^2$ was formed in a Teflon (registered trademark) plate having a thickness of 1 mm. The Teflon (registered trademark) plate was placed on a glass plate, and the opening was filled with copper paste for joining, and copper paste for joining overflowing from the opening was removed by a metal squeeze. The Teflon (registered trademark) plate was detached from the glass plate, and was set in a tube furnace. The Teflon plate was heated to 150° C. while allowing an argon gas to flow at a flow rate of 0.3 L/min, and was retained for 1 hour to remove the solvent. In this state, the gas was changed into a hydrogen gas (300 mL/min), a temperature was raised to 350° C., and a sintering was performed for 60 minutes, thereby obtaining a sintered metal layer. Then, the flow rate of the argon gas was changed to 0.3 L/min and cooling was performed. Then, the sintered metal layer, which was cooled to 50° C. or lower, was taken out into the air. A plate-shaped sintered metal layer was peeled off from the glass plate, and was polished with sand paper (No. 800) to obtain a plate-shaped sample in which a surface having a size of 10×10 mm$^2$ was flat. The dimensions of a length, a width, and a thickness of the plate-shaped sample were measured, and a weight of the plate-shaped sample was measured. A density of the plate-shaped sample was calculated from these values, and the volume ratio of the metal copper was calculated in accordance with the following Expression.

Amount (% by volume) of copper contained in sintered metal layer=density of (g/cm$^3$)/8.96 (g/cm$^3$)×100(%) of plate-shaped sample (3) Observation of Cross-Sectional Morphology A joined body was fixed to the inside of a cup with a sample clip (samplklip I, manufactured by Buehler), an epoxy casting resin (Epomount, manufactured by Refine Tec Ltd.) was poured to the periphery of the joined body until the entirety of the sample was embedded, and the cup was left to stand in a vacuum desiccator, and a pressure was reduced for 1 minute for defoaming. Then, the joined body was left to stand at room temperature for 10 hours to cure the epoxy casting resin, thereby preparing a sample. The sample was cut in the vicinity of the silicon chip by using Refine Saw Eccel (manufactured by Refine Tec Ltd.). The sample was ground to the vicinity of the center of the joined body by using water-resistant abrasive paper (Carbomac paper, manufactured by Refine Tec Ltd.)-attached polishing apparatus (Refine Polisher Hv, manufactured by Refine Tec Ltd.) to expose a cross-section. An excessive epoxy casting resin of the polished sample was ground to a size capable of being processed with an ion milling apparatus. An ion milling apparatus (IM4000, manufactured by Hitachi High-Technologies Corporation) was used in a CP processing mode, and a cross-section of the size-processed sample was processed under conditions of an argon gas flow rate of 0.07 to 0.1 cm$^3$/min and a processing time of 120 minutes. The resultant sample was set as a sample for SEM. A cross-section of the sintered metal layer in the SEM sample for SEM was observed with a SEM-EDX apparatus (ESEM XL30, manufactured by PHILIPS) at an application voltage of 15 kV.

(4) Calculation of Degree of Orientation Order

The SEM image at a magnification of 3000 times, which was obtained in "(3) Observation of Cross-Sectional Morphology", was scanned with ImageJ (manufactured by Microsoft). As the SEM image, an image in which a joining interface between the substrate or the silicon chip and the sintered metal layer was captured was used. A [T] key was pressed to display ROI manage window, and a check box of Show All was checked. Straight Line was selected from a main window. At a dense continuous portion having a linear shape, a rectangular parallelepiped shape, or an elliptical shape on an image, when the longest straight line among straight lines included in the portion is set as the major axis, and the longest straight line among straight lines which are included in the portion and are perpendicular to the major axis is set as the thickness, a structure in which the size of the major axis is 1 μm or greater and a ratio of the major axis/the thickness is 4 or greater is specified as the flake-shaped structure. From an end to an end of a cross-section of the flake-shaped structure was clicked and dragged to draw a line, and the [T] key was pressed to for registration in the ROI Manager window. The operation was repeated with respect to shapes derived from the flake-shaped structure on a screen without redundancy. However, a shape derived from a flake-shaped structure, which protrudes from a screen end and thus an image thereof is cut out, was not selected. Next, a measure button in the ROI Manager window was pressed. A measured angle is displayed in Results window, and thus a file was saved through an operation of [File]→[Save As]. In a case where a joining interface with the substrate or the silicon chip deviated from a horizontal direction with respect to the image, the angle was measured in the same manner. A file of saved results was scanned in Microsoft Excel. In a case where the interface of the substrate or the silicon chip, and the sintered metal layer deviated from a horizontal direction with respect to the image, an angle of the joining interface was subtracted from each piece of angle that was measured. $\cos^2 \theta$ was obtained for each piece of angle $\theta$, and an average value $<\cos^2 \theta>$ was calculated, and the average value was substituted for $S=\frac{1}{2}\times(3<\cos^2 \theta>-1)$ to calculate the degree of orientation order S.

In a case where S was 0.83 or greater, it was determined that the flake-shaped structure, which were oriented in approximately parallel to an interface between a member and the sintered metal layer, was present.

(5) Calculation of Ratio of Major Axis and Thickness of Flake-Shaped Structure

The SEM image at a magnification of 5000 times, which was obtained in "Observation of Cross-Sectional Morphology", was scanned with Image J (manufactured by National Institutes of Health). Straight Line was selected from a main window. From an end to an end of a scale (in this example, a scale of 5 μm) on a lower side of an image was clicked and dragged to draw a line, and [Analyze]→[Set Scale] was selected from the main window to display a Set Scale window. "5" was input to a box of "Known Distance:", "μm" was input to a box of "Unit of length:", and then "OK" button was clicked. A [T] key was pressed to display ROI Manager window, and a check box of Show All was checked. The flake-shaped structure was specified by the same method as in (4), and from an end to an end of a cross-section of the flake-shaped structure on the image was clicked and dragged to draw a line, and the [T] key was pressed to for registration in the ROI Manager window. The operation was repeated with respect to shapes derived from the flake-shaped structure on a screen without redundancy. However, a shape derived from a flake-shaped structure, which protrudes from a screen end and thus an image thereof is cut out, was not selected. Next, a Measure button in the ROI Manager window was pressed. A measured length is displayed on the Results window, and thus a file was saved through an operation of [File]→[Save As]. In the same manner, a length of the cross-section of the flake-shaped structure on the image in the thickness direction was measured, and was saved in a file. The saved file was read out with Microsoft Excel, and an average of length measurement results was calculated. In this manner, the average of the major axis of the flake-shaped structure and the average of the thickness of the flake-shaped structure were obtained. In addition, the average of the major axis of the flake-shaped structure was divided by the average of the thickness of the plate-shaped structure to obtain "ratio of a number-average length in the major axis direction and a number-average length in the thickness direction in the flake-shaped structure".

(6) Ratio of Copper Element in Element Other than Light Element

The sample for SEM, which was obtained in "(3) Observation of Cross-Sectional Morphology", was set in the SEM-EDX apparatus, and a visual field was set so that the entirety of a screen became the sintered metal layer under conditions of a work distance within 10 mm, Spot: 4, an application voltage of 15 kV, and a magnification of 5000 times. A focus was adjusted, and enigma correction was performed as necessary. A measurement program "EDX Control" of EDX was started up, an integration button was pressed, integration was performed for 5 minutes. A spectrum obtained in the measurement program was identified (automatic). At this time, peaks of light element (Li, Be, B, C, N, and O) were excluded from a detection target. In addition, after performing setting (automatic) of a baseline, calculation of a composition ratio was performed to quantify a composition ratio of respective components. A ratio of copper was set "Ratio of Copper Element in Elements Other Than Light Element".

(7) Thermal Conductivity

The plate-shaped sample manufactured in "(2) Volume Ratio of Metal Copper" was used, and thermal diffusivity thereof was measured by a laser flash method (LFA467, manufactured by Netch. Co. Ltd). The thermal conductivity [W/(m·k)] of the silver sintered body at 25° C. was calculated by the product of the thermal diffusivity, specific heat capacity obtained by a differential scanning calorimeter (DSC8500, manufactured by PerkinElmer Co., Ltd.), and the density obtained in "(2) Volume Ratio of Copper Metal".

(8) Temperature Cycle Connection Reliability Test

A joined body in which a copper plate (19×25×3 mm$^3$) and a silicon chip (chip thickness: 600 µm) of which a joining surface of 4×8 mm$^2$ was formed from nickel were joined by the sintered metal layer was obtained in the same manner as in "(1) Die Shear Strength". An adhesiveness improving material (HIMAL, manufactured by Hitachi Chemical Co., Ltd.) was applied onto the joined body and was dried. Then, the resultant joined body was sealed with a solid sealing material (CEL, manufactured by Hitachi Chemical Co., Ltd.), thereby obtaining a temperature cycle test specimen. The temperature cycle test specimen was set in a temperature cycle tester (TSA-72SE-W, Manufactured by ESPEC CORP.) to perform a temperature cycle connection reliability test under conditions in which low-temperature side: −40° C. and 15 minutes, room temperature: 2 minutes, high-temperature side: 200° C. and 15 minutes, and a damage prevention cycle: automatic, and the number of cycles: 1000 cycles. An SAT image of a joining state at an interface between the sintered metal layer and the substrate or the chip before and after the temperature cycle connection reliability test was obtained by using an ultrasonic flaw detection device (Insight-300, manufactured by Insight CO., LTD.), and investigation was made as to whether or not peeling-off occurred. In a case where a peeled-off area of the joining portion was less than 20 area %, determination was made as satisfactory (o), and in a case where the peeled-off area was 20 area % or more, determination was made as failure (x).

(9) Measurement of Content Ratio of Flake-Shaped Structure in Joined Body

The same SEM image as that was used in (5) was scanned with the Image J, and [Image]→[Type]→[RGB color] was selected. Next, Threshold Color window was displayed by selecting [Image]→[Adjust]→[Color Threshold]. In a graph of Brightness of the Threshold Color window, the lower limit of brightness was matched to an inflection point on a dark color side of a distribution curve, and the upper limit was set to a position of 100% on a bright color side. Then, "Select" of the Threshold Color window was pressed to select a metal sintered body portion on the SEM image. In this state, [Analyze]→[Measure] was pressed to calculate a cross-sectional area of the sintered body portion. On the other hand, the major axis and the thickness of the flake-shaped structure specified in (5) were multiplied, and the resultant area was added to the cross-sectional area to calculate a cross-sectional area of the flake-shaped structure portion. From an expression of {(cross-sectional area of flake-shaped structure portion)/(cross-sectional area of sintered body portion)×100}, a content ratio (%) of the flake-shaped structure in the entirety of the joined body was calculated.

Example 1

5.2 g of α-terpineol (manufactured by Wako Pure Chemical Industries, Ltd.) and 6.8 g of isobornyl cyclohexanol (MTPH, manufactured by Nippon Terpene Chemicals, Inc.) as a dispersion medium, and 52.8 g of CH0200 (manufactured by MITSUI MINING & SMELTING CO., LTD., the amount of copper particles of 0.12 µm to 0.8 µm: 95% by mass or greater) as sub-micro copper particles were mixed in a plastic bottle, and the mixed solution was treated by an ultrasonic homogenizer (US-600, manufactured by Nippon Seiki Co., Ltd.) at 19.6 kHz and 600 W for 1 minute, thereby obtaining an dispersed solution. 35.2 g of MA-C025 (manufactured by MITSUI MINING & SMELTING CO., LTD., the amount of copper particles having the maximum particle size of 1 µm to 20 µm: 100% by mass) as flake-shaped micro copper particles was added to the dispersed solution, and was mixed with a spatula until a dry powder disappeared. The plastic bottle was hermetically sealed, and was stirred by a rotation and revolution type stirrer (Planetary Vacuum Mixer ARV-310, manufactured by THINKY CORPORATION) at 2000 rpm for 2 minutes, and was stirred under a reduced pressure at 2000 rpm for 2 minutes, thereby obtaining copper paste for joining. A joined body was prepared by using the copper paste for joining, and various kinds of measurement and analysis were performed by using the copper paste for joining.

Examples 2 and 3

Copper paste for joining was obtained in the same manner as in Example 1 except that a charge-in quantity described in Table 1 was used. A joined body was prepared by using the copper paste for joining, and various kinds of measurement and analysis were performed.

Example 4

Copper paste for joining was obtained in the same manner as in Example 1 except that 35.2 g of 3L3 (manufactured by FUKUDA METAL FOIL & POWDER CO., LTD., the amount of copper particles having a maximum particle size of 1 µm to 20 µm: 100% by mass) which are flake-shaped micro copper particles were used as copper particles instead of MA-C025 which are flake-shaped micro copper particles. A joined body was prepared by using the copper paste for joining, and various kinds of measurement and analysis were performed.

Example 5

Copper paste for joining was obtained in the same manner as in Example 1 except that 35.2 g of 1110F (manufactured by MITSUI MINING & SMELTING CO., LTD., the amount of copper particles having a maximum particle size of 1 μm to 20 μm: 100% by mass) which are flake-shaped micro copper particles were used as copper particles instead of MA-C025 which are flake-shaped micro copper particles. A joined body was prepared by using the copper paste for joining, and various kinds of measurement and analysis were performed.

Example 6

The same copper paste for joining as in Example 4 was used. A joined body was prepared by using the paste for joining and a silicon chip (chip thickness: 600 μm) in which titanium, nickel, and gold were formed in this order, and a joining surface of 3×3 mm$^2$ was formed from gold, and "(1) Measurement of Die Shear Strength" was performed. In addition, "(8) Temperature Cycle Connection Reliability Test" was performed by using a silicon chip (chip thickness: 600 μm) in which a joining surface of 4×8 mm$^2$ was formed from gold.

Example 7

The same copper paste for joining as in Example 4 was used. A joined body was prepared by using the paste for joining and a silicon chip (chip thickness: 600 μm) in which titanium, nickel, and silver were formed in this order, and a joining surface of 3×3 mm$^2$ was formed from gold, and "(1) Measurement of Die Shear Strength" was performed. In addition, "(8) Temperature Cycle Connection Reliability Test" was performed by using a silicon chip (chip thickness: 600 μm) in which a joining surface of 4×8 mm$^2$ was formed from silver.

Comparative Example 1

Copper paste for joining was obtained in the same manner as in Example 1 except that 35.2 g of Cu-HWQ 3 μm (atomized powder, manufactured by FUKUDA METAL FOIL & POWDER CO., LTD.) which is a pseudo-spherical particle was used as copper particles instead of MA-C025 which are flake-shaped micro copper particles. A joined body was prepared by using the copper paste for joining, and various kinds of measurement and analysis were performed.

Comparative Examples 2 to 5

Copper paste for joining was obtained in the same manner as in Example 1 except that a composition described in Table 2 was used. A joined body was prepared by using the copper paste for joining, and various kinds of measurement and analysis were performed.

Comparative Example 6

Copper paste for joining was obtained in the same manner as in Example 1 except that 52.8 g of CS-10 (50% volume-average particle size: 1 μm, manufactured by MITSUI MINING & SMELTING CO., LTD.) which is a spherical copper particle was used as copper particles instead of CH0200. A joined body was prepared by using the copper paste for joining, and various kinds of measurement and analysis were performed.

Comparative Example 7

Copper paste for joining was obtained by adding 0.88% by mass of acetic acid (0.88 g) to the copper paste for joining in Example 1. A joined body was prepared by using the copper paste for joining, and various kinds of measurement and analysis were performed.

Comparative Example 8

Copper paste for joining was obtained in the same manner as in Example 1 except that 26.4 g of copper (II) oxide particles (synthesized object) and 26.4 g of CH0200 were used as copper particles instead of 52.8 g of CH0200. A joined body was prepared by using the copper paste for joining, and various kinds of measurement and analysis were performed.

Comparative Example 9

Sheet-shaped high temperature lead solder (93.5Pb5Sn1.5Ag, manufactured by Senju Metal Industry Co., Ltd.) having a thickness of 100 μm was cut out into a size of 3×3 mm$^2$. A carbon jig having an opening of 3.5×3.5 mm$^2$ was placed on a copper plate (19×25×3 mm$^3$), and the cut-out high temperature lead solder and a silicon chip (chip thickness: 600 μm) in which a joining surface of 3×3 mm$^2$ was formed from nickel were set in the opening of the carbon jig in this order. Heating was performed in a hydrogen oven under conditions of a hydrogen atmosphere and the highest temperature of 350° C. to join the copper plate and the silicon chip with the high temperature lead solder, thereby obtaining a joined sample. Various kinds of measurement and analysis were performed by using the joined sample.

Comparative Example 10

75 g of LM1 (manufactured by TOKUSEN KOGYO Co., ltd.) and 25 g of AgC239 (manufactured by FUKUDA METAL FOIL & POWDER CO., LTD.) as silver particles, 13.6 g of terpineol (manufactured by Wako Pure Chemical Industries, Ltd.) as a dispersion medium, 1 g of steric acid (manufactured by New Japan Chemical Co., Ltd.) as an additive were weighed and mixed, and the resultant mixture was kneaded by using a Raikai mixer for 15 minutes, thereby preparing silver paste for joining. Baking was performed under conditions of retention on a hot plate heated to 110° C. for 10 minutes in the air, and retention on a hot plate heated to 200° C. for 60 minutes in the air, thereby manufacturing a sintered silver joined sample. Various measurement and analysis were performed.

The composition of the paste for joining prepared in Examples and Comparative Examples are illustrated in Table 1 and Table 2. In addition, measurement results in Examples and Comparative Examples are illustrated in Table 3 and Table 4.

TABLE 1

| | Material | Unit | Example 1 | Example 2 | Example 3 | Example 4 | Example 5 | Example 6 | Example 7 |
|---|---|---|---|---|---|---|---|---|---|
| Dispersion medium | α-terpineol | (g) | 5.2 | 6.0 | 6.0 | 5.2 | 5.2 | 5.2 | 5.2 |
| | Isobornyl cyclohexanol | (g) | 6.8 | 6.0 | 6.0 | 6.8 | 6.8 | 6.8 | 6.8 |
| | Acetic acid | (g) | — | — | — | — | — | — | — |

TABLE 1-continued

| | Material | Unit | Example 1 | Example 2 | Example 3 | Example 4 | Example 5 | Example 6 | Example 7 |
|---|---|---|---|---|---|---|---|---|---|
| Sub-micro copper particles | CH-0200 | (g) | 52.8 | 61.6 | 44 | 52.8 | 52.8 | 52.8 | 52.8 |
| Flake-shaped micro copper particles | MA-C025 | (g) | 35.2 | 26.4 | 44 | — | — | — | — |
| | 3L3 | (g) | — | — | — | 35.2 | — | 35.2 | 35.2 |
| | 1110F | (g) | — | — | — | — | 35.2 | — | — |
| Spherical copper particles | Cu-HWQ3 μm | (g) | — | — | — | — | — | — | — |
| | CS-10 | (g) | — | — | — | — | — | — | — |
| | Copper (II) oxide particles | (g) | — | — | — | — | — | — | — |
| Silver particles | LM1 | (g) | — | — | — | — | — | — | — |
| | AgC239 | (g) | — | — | — | — | — | — | — |
| Additive | Stearic acid | (g) | — | — | — | — | — | — | — |

TABLE 2

| | Material | Unit | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|---|---|
| Dispersion medium | α-terpineol | (g) | 5.2 | 6.0 | 6.0 | 6.0 | 6.0 | 5.2 | 4.8 | 5.2 | — | 13.6 |
| | Isobornyl cyclohexanol | (g) | 6.8 | 6.0 | 6.0 | 6.0 | 6.0 | 6.8 | 6.3 | 6.8 | — | — |
| | Acetic acid | (g) | — | — | — | — | — | — | 0.88 | — | — | — |
| Sub-micro copper particles | CH-0200 | (g) | 52.8 | 88 | 26.4 | 8.8 | 0 | — | 52.8 | 26.4 | — | — |
| Flake-shaped micro copper particles | MA-C025 | (g) | — | 0 | 61.6 | 79.2 | 88 | 35.2 | 35.2 | 35.2 | — | — |
| | 3L3 | (g) | — | — | — | — | — | — | — | — | — | — |
| | 1110F | (g) | — | — | — | — | — | — | — | — | — | — |
| Spherical copper particles | Cu-HWQ3 μm | (g) | 35.2 | — | — | — | — | — | — | — | — | — |
| | CS-10 | (g) | — | — | — | — | — | — | 52.8 | — | — | — |
| | Copper (II) oxide particles | (g) | — | — | — | — | — | — | — | 26.4 | — | — |
| Silver particles | LM1 | (g) | — | — | — | — | — | — | — | — | — | 75 |
| | AgC239 | (g) | — | — | — | — | — | — | — | — | — | 25 |
| Additive | Stearic acid | (g) | — | — | — | — | — | — | — | — | — | 1 |

TABLE 3

| Items | Example 1 | Example 2 | Example 3 | Example 4 | Example 5 | Example 6 | Example 7 |
|---|---|---|---|---|---|---|---|
| Material of joining surface of substrate | Copper | Copper | Copper | Copper | Copper | Copper | Copper |
| Material of joining surface of chip | Nickel | Nickel | Nickel | Nickel | Nickel | Nickel | Nickel |
| Ratio of copper element (% by mass) | 100 | 100 | 100 | 100 | 100 | 100 | 100 |
| Amount of copper contained (% by volume) | 72 | 73 | 71 | 85 | 81 | 84 | 85 |
| Degree of orientation order of flake-shaped structure | 0.88 | 0.94 | 0.92 | 0.98 | 0.92 | 0.95 | 0.97 |
| Major axis of flake-shaped structure (μm) | 4.8 | 5.1 | 4.8 | 4.8 | 4.9 | 5.0 | 4.9 |
| Ratio of major axis and thickness of flake-shaped structure | 8.9 | 9.3 | 6.7 | 10 | 8.6 | 10.1 | 9.8 |
| Presence or absence of "flake-shaped structure" oriented in approximately parallel to interface | Present | Present | Present | Present | Present | Present | Present |
| Ratio of flake-shaped structure (%) | 21 | 23 | 21 | 28 | 26 | 27 | 28 |

TABLE 3-continued

| Items | Example 1 | Example 2 | Example 3 | Example 4 | Example 5 | Example 6 | Example 7 |
|---|---|---|---|---|---|---|---|
| Thermal conductivity (W/(m · K)) | 180 | 180 | 169 | 190 | 187 | 180 | 180 |
| Die shear strength (MPa) | 45 | 38 | 28 | 47 | 22 | 31 | 33 |
| Temperature cycle connection reliability | ○ | ○ | ○ | ○ | ○ | ○ | ○ |

TABLE 4

| Items | Comparative Example 1 | Comparative Example 2 | Comparative Example 3 | Comparative Example 4 | Comparative Example 5 | Comparative Example 6 | Comparative Example 7 | Comparative Example 8 | Comparative Example 9 | Comparative Example 10 |
|---|---|---|---|---|---|---|---|---|---|---|
| Material of joining surface of substrate | Copper | Copper | Copper | Copper | Copper | Copper | Copper | Copper | Copper | Silver |
| Material of joining surface of chip | Nickel | Nickel | Nickel | Nickel | Nickel | Nickel | Nickel | Nickel | Nickel | Silver |
| Ratio of copper element (% by mass) | 100 | 100 | 100 | 100 | 100 | 100 | 100 | 100 | 0 | 0 |
| Amount of copper contained (% by volume) | 64 | 72 | 48 | 47 | 42 | 60 | 61 | 60 | 0 | 0 |
| Amount of copper contained (% by volume) | — | — | 0.89 | 0.62 | 0.47 | 0.91 | 0.83 | 0.76 | — | — |
| Major axis of flake-shaped structure (μm) | — | — | 4.2 | 4.4 | 3.7 | 4.4 | 4.6 | 4.4 | — | — |
| Ratio of major axis and thickness of flake-shaped structure | — | — | 8.7 | 8.6 | 7 | 7 | 8.8 | 8.4 | — | — |
| Presence or absence of "flake-shaped structure" oriented in approximately parallel to interface | — | — | Present | — | — | — | Present | — | — | — |
| Ratio of flake-shaped structure (%) | 0 | 0 | 65 | 86 | 99 | 35 | 35 | 36 | — | — |
| Thermal conductivity (W/(m · K)) | 140 | Hard to measure | 80 | Hard to measure | Hard to measure | Hard to measure | 134 | 100 | 30 | 132 |
| Die shear strength (MPa) | 38 | 0.4 | 19 | 6 | 0.3 | 3 | 11 | 10 | 25 | 33 |
| Temperature cycle connection reliability | X (Partial peeling-off) | X (Initial failure) | X (Entire peeling-off) | X (Entire peeling-off) | X (Initial failure) | X (Initial failure) | X (Entire peeling-off) | X (Entire peeling-off) | ○ | X (Entire peeling-off) |

Figure 13:
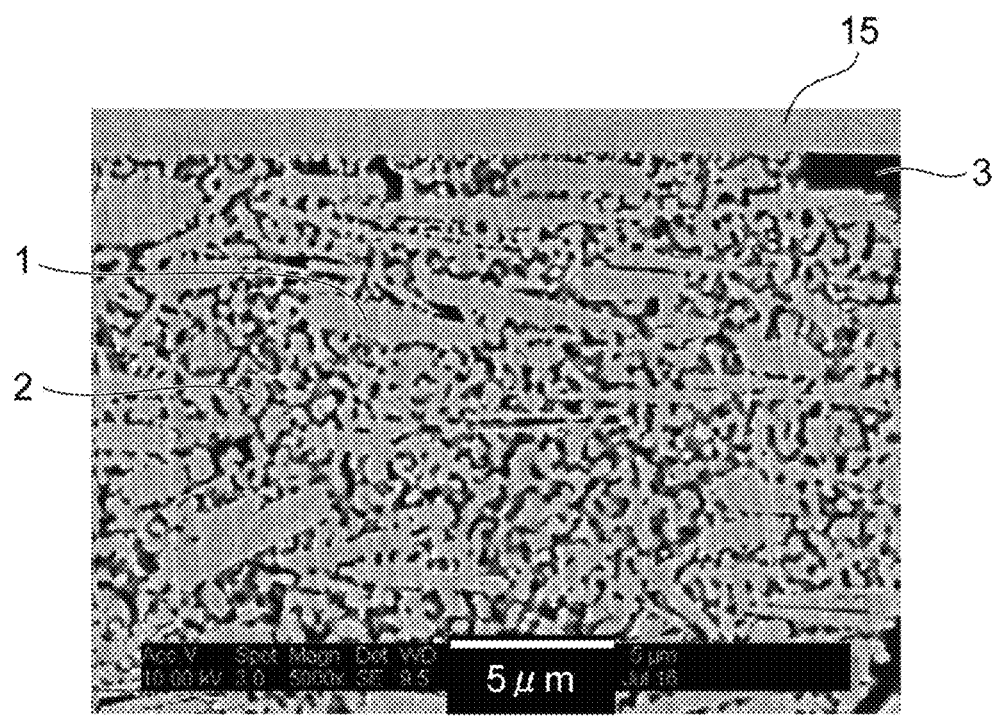
FIG. 13 is a SEM image illustrating a cross-section of a joined body in Example 1.
Figure 14:
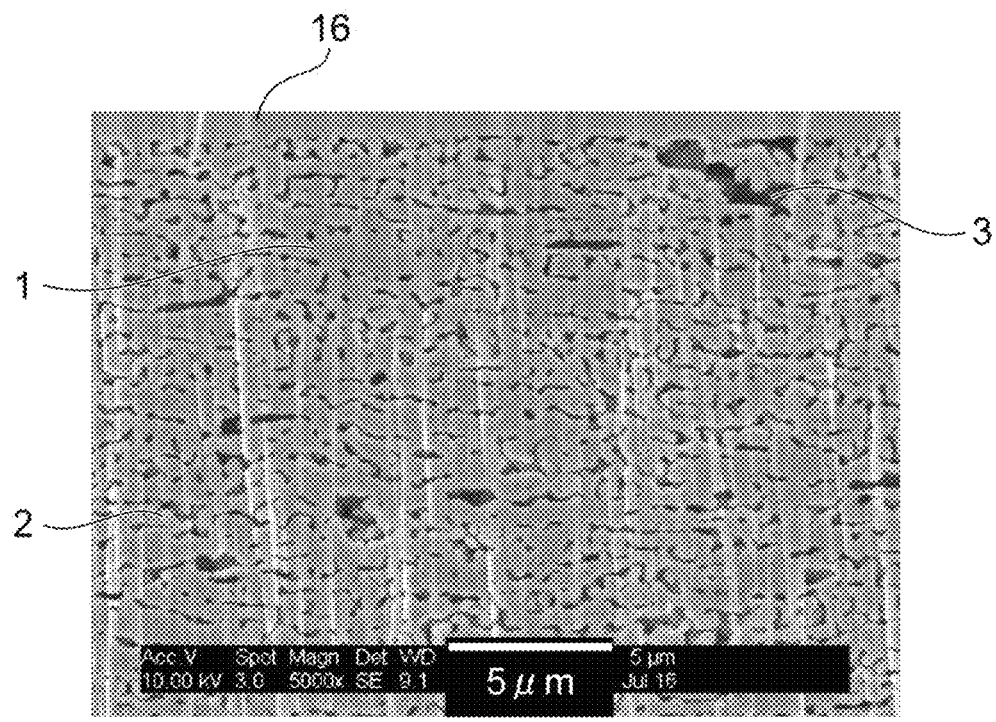
FIG. 14 is a SEM image illustrating a cross-section of a joined body in Example 4.
Figure 15:
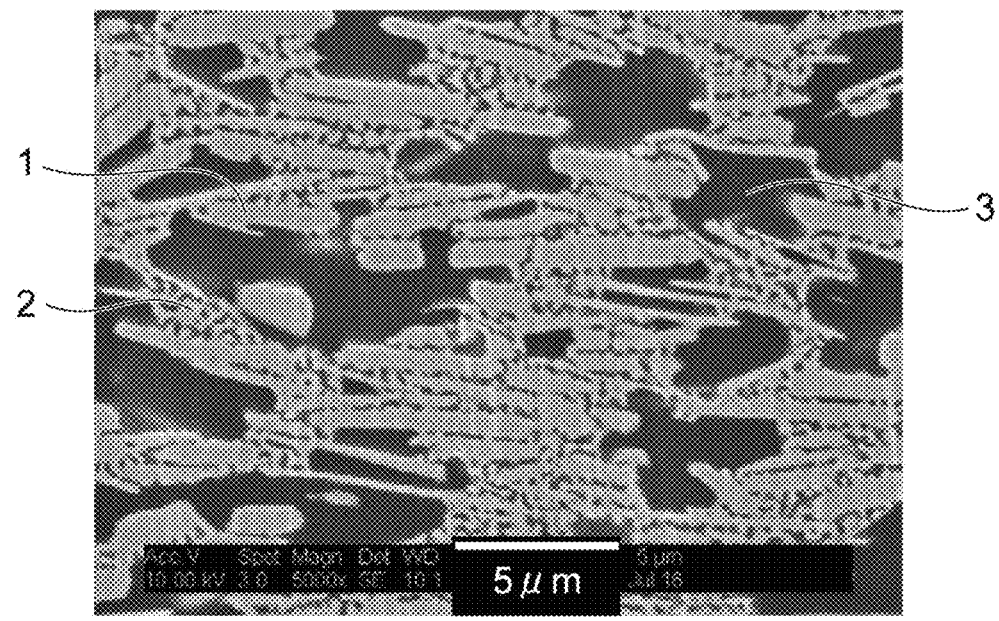
FIG. 15 is a SEM image illustrating a cross-section of a joined body in Comparative Example 3.
Figure 16:
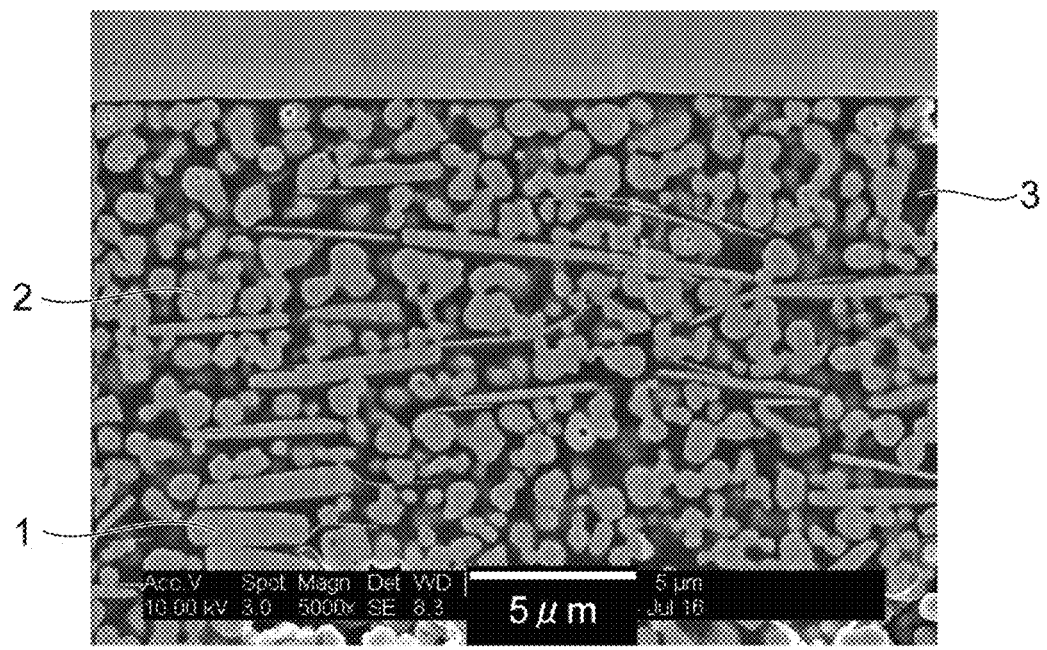
FIG. 16 is a SEM image illustrating a cross-section of a joined body in Comparative Example 6.

As illustrated in the results of Examples, in a case where the sintered metal layer includes the flake-shaped structure, and the amount of copper contained in the sintered metal layer is 65% by volume or greater, the joined body was excellent in thermal conductivity, die shear strength, and connection reliability. FIG. 13 and FIG. 14 illustrate SEM images of joined bodies in Example 1 and Example 4. In the joined bodies in Examples, it can be seen that in the copper sintered body, a vacancy of sintered copper 1 having a plurality of flake-shaped structures which are oriented in approximately parallel to a chip 15 or 16 is densely filled with sintered copper 2 derived from copper particles. In Examples, it is considered that the sintered metal layer includes the flake-shaped structure, and thus stress concentration is dispersed, and copper particles are strongly and densely bonded to each other, and thus a joined body excellent in die shear strength is obtained.

Figure 17:
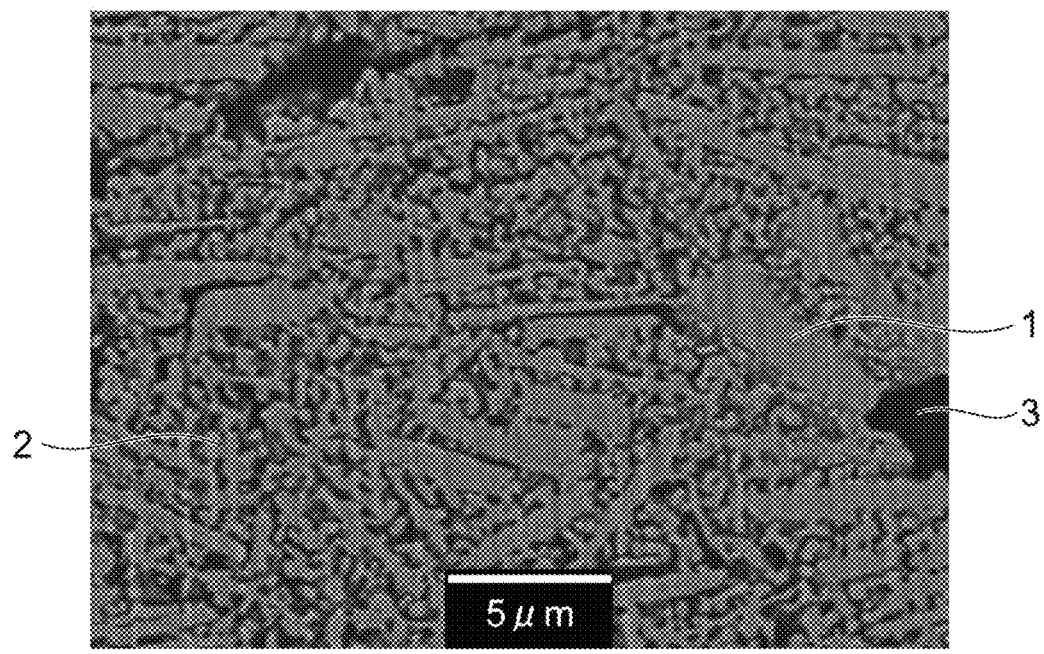
FIG. 17 is a SEM image illustrating a cross-section of a joined body in Comparative Example 7.
Figure 18:
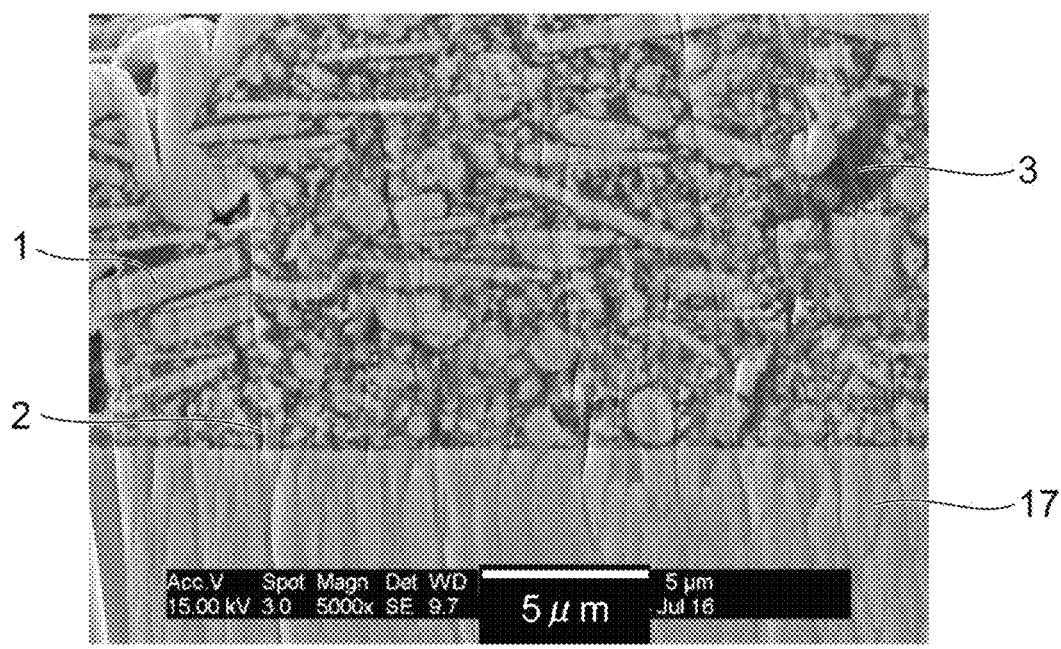
FIG. 18 is a SEM image illustrating a cross-section of a joined body in Comparative Example 8.

On the other hand, joined bodies of Comparative Examples did not have excellent thermal conductivity, die shear strength, and connection reliability. FIG. 15 to FIG. 18 illustrate SEM images of the joined bodies of Comparative Example 3 and Comparative Examples 6 to 8. From results thereof, it is considered that when the amount of copper contained in the sintered metal layer is less, a vacancy 3 increases, joining of sintered copper 1 having a flake-shaped structure becomes weak, joining between the substrate and the chip, the sintered metal layer becomes weak, and the thermal conductivity, the die shear strength, and the connection reliability of the joined body deteriorate. In addition, as illustrated in FIG. 17 and FIG. 18, in the joined bodies of Comparative Examples 7 and 8, it is considered that since the sintered copper 1 having the flake-shaped structure in a sintered body is not oriented in approximately parallel to a substrate 17 or a chip, and thus stress concentration is not dispersed, and this also becomes the cause for deterioration of the thermal conductivity, the die shear strength, or the connection reliability of the joined bodies.

In Comparative Example 9 in which the high temperature lead solder was used, the die shear strength and the connection reliability were satisfactory, but the thermal conductivity was low. In addition, in Comparative Example 10 in which silver paste for connection was used, the thermal conductivity and the die shear strength were excellent, but the connection reliability was not excellent. From these results, it can be seen that the joined body of the invention is more excellent in the thermal conductivity, the die shear strength, and the connection reliability in comparison to a joined body using a joining material of the related art.

REFERENCE SIGNS LIST

1: Sintered copper having flake-shaped structure, 2: Sintered copper derived from copper particles, 3: Vacancy, 4: Sintered metal layer, 5: First member, 6: Second member, 8:

Thickness of flake-shaped structure, 9: Major axis of flake-shaped structure, 10: Chip, 11a. 11b: Lead frame, 12: Wire, 13: Mold resin, 14: Semiconductor element, 15: Chip (joining surface: gold), 16: Chip (joining surface: silver), 17: Substrate, 100: Joined body, 110: Semiconductor device, 21: Insulating substrate, 22: First electrode, 23: Semiconductor element, 24: Second electrode, 25: Metal interconnection, 26: Third electrode, 27: Wire, 28: Copper plate, 29: Insulator, 30: Block body, 31: Sealing material, 32: First thermal conduction member, 33: Second thermal conduction member, 34: Electrode, 35: Wire, 200: Semiconductor device, 210: Semiconductor device, 220: Semiconductor device, 300: Semiconductor device, 310: Semiconductor device, 320: Semiconductor device, 400: Semiconductor device.

The invention claimed is:

1. A joined body, comprising:
a first member;
a second member; and
a sintered metal layer that joins the first member and the second member,
wherein the sintered metal layer includes a plurality of flake-shaped structures derived from flake-shaped copper particles, major axes of the plurality of flake-shaped structures being oriented in approximately parallel to an interface between the first member or the second member, and the sintered metal layer,
the amount of copper contained in the sintered metal layer is 65% by volume or greater on the basis of a volume of the sintered metal layer, and
a degree of orientation order S of the plurality of flake-shaped structures, as expressed by the following formula, is 0.88 to 1.00:

$$S = \frac{1}{2} \times (3 \langle \cos^2 \theta \rangle - 1)$$

$\theta$ representing an angle made by the interface and the major axis of a flake-shaped structure of the plurality of flake shaped structures, and $\langle \cos^2 \theta \rangle$ representing an average value of a plurality of values of $\cos^2 \theta$ for the plurality of flake-shaped structures.

2. The joined body according to claim 1,
wherein at least one of the first member and the second member includes at least one kind of metal selected from the group consisting of copper, nickel, silver, gold, and palladium on a surface that is in contact with the sintered metal layer.

3. A semiconductor device, comprising:
a first member;
a second member; and
a sintered metal layer that joins the first member and the second member,
wherein at least one of the first member and the second member is a semiconductor element,
the sintered metal layer includes a plurality of flake-shaped structures derived from flake-shaped copper particles, major axes of the plurality of flake-shaped structures being oriented in approximately parallel to an interface between the first member or the second member, and the sintered metal layer,
the amount of copper contained in the sintered metal layer is 65% by volume or greater on the basis of a volume of the sintered metal layer, and
a degree of orientation order S of the plurality of flake-shaped structures, as expressed by the following formula, is 0.88 to 1.00:

$$S = \frac{1}{2} \times (3 \langle \cos^2 \theta \rangle - 1)$$

$\theta$ representing an angle made by the interface and the major axis of a flake-shaped structure of the plurality of flake shaped structures, and $\langle \cos^2 \theta \rangle$ representing an average value of a plurality of values of $\cos^2 \theta$ for the plurality of flake-shaped structures.

4. The semiconductor device according to claim 3,
wherein die shear strength when the semiconductor element is pressed in a horizontal direction is 30 MPa or greater.

5. A semiconductor device, comprising:
a first electrode;
a semiconductor element that is electrically connected to the first electrode;
a second electrode that is electrically connected to the semiconductor element through a metal interconnection; and
a sintered metal layer including copper provided between the semiconductor element and the metal interconnection, and between the metal interconnection and the second electrode,
wherein the sintered metal layer is in contact with the metal interconnection and includes a plurality of flake-shaped structures derived from flake-shaped copper particles, major axes of the plurality of flake-shaped structures being oriented in approximately parallel to an interface with the metal interconnection, and
a degree of orientation order S of the plurality of flake-shaped structures, as expressed by the following formula, is 0.88 to 1.00:

$$S = \frac{1}{2} \times (3 \langle \cos^2 \theta \rangle - 1)$$

$\theta$ representing an angle made by the interface and the major axis of a flake-shaped structure of the plurality of flake shaped structures, and $\langle \cos^2 \theta \rangle$ representing an average value of a plurality of values of $\cos^2 \theta$ for the plurality of flake-shaped structures.

6. The semiconductor device according to claim 5,
wherein
the amount of copper contained in the sintered metal layer is 65% by volume or greater on the basis of a volume of the sintered metal layer.

7. A semiconductor device, comprising:
a first thermal conduction member;
a second thermal conduction member;
a semiconductor element that is disposed between the first thermal conduction member and the second thermal conduction member; and
at least one sintered metal layer including copper provided at one or more locations selected from between the first thermal conduction member and the semiconductor element, and between the semiconductor element and the second thermal conduction member,
wherein a sintered metal layer of at least one sintered metal layer is in contact with the first thermal conduction member or the second thermal conduction member, and includes a plurality of flake-shaped structures derived from flake-shaped copper particles, major axes of the plurality of flake-shaped structures being oriented in approximately parallel to an interface with the first thermal conduction member or the second thermal conduction member, and
a degree of orientation order S of the plurality of flake-shaped structures, as expressed by the following formula, is 0.88 to 1.00:

$$S = \frac{1}{2} \times (3 \langle \cos^2 \theta \rangle - 1)$$

θ representing an angle made by the interface and the major axis of a flake-shaped structure of the plurality of flake shaped structures, and $<\cos^2 \theta>$ representing an average value of a plurality of values of $\cos^2 \theta$ for the plurality of flake-shaped structures.

8. The semiconductor device according to claim 7, wherein
the amount of copper contained in the sintered metal layer is 65% by volume or greater on the basis of a volume of the sintered metal layer.

9. The semiconductor device according to claim 5, comprising an insulating substrate having the first electrode and the second electrode provided on the substrate.

\* \* \* \* \*